(12) United States Patent
Mangu et al.

(10) Patent No.: US 12,713,902 B2
(45) Date of Patent: Aug. 18, 2026

(54) ENGINEERED DIELECTRIC PROFILE FOR HIGH ASPECT-RATIO 3D NAND STRUCTURES

(71) Applicant: Intel NDTM US LLC, Santa Clara, CA (US)

(72) Inventors: Vijay Saradhi Mangu, Albuquerque, NM (US); Henok T. Mebrahtu, Rio Rancho, NM (US); Agus Tjandra, Milpitas, CA (US); Ee Ee Eng, Peoria, AZ (US); Randy J. Koval, Albuquerque, NM (US)

(73) Assignee: INTEL NDTM US LLC, Santa Clara, CA (US)

( * ) Notice: Subject to any disclaimer, the term of this patent is extended or adjusted under 35 U.S.C. 154(b) by 246 days.

(21) Appl. No.: 18/196,669

(22) Filed: May 12, 2023

(65) Prior Publication Data

US 2023/0282578 A1 Sep. 7, 2023

(51) Int. Cl.
*H10W 20/41* (2026.01)
*H10B 41/27* (2023.01)
(Continued)

(52) U.S. Cl.
CPC .......... *H10W 20/435* (2026.01); *H10B 41/27* (2023.02); *H10B 41/35* (2023.02);
(Continued)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30;
(Continued)

(56) References Cited

U.S. PATENT DOCUMENTS

| | | | | |
|---|---|---|---|---|
| 2010/0213527 | A1* | 8/2010 | Shim | H10B 43/20 257/E27.06 |
| 2011/0024818 | A1* | 2/2011 | Ahn | H10D 30/693 257/314 |
| 2014/0084364 | A1* | 3/2014 | Taniguchi | H10D 30/63 257/330 |

* cited by examiner

*Primary Examiner* — William B Partridge
*Assistant Examiner* — Gustavo G Ramallo
(74) *Attorney, Agent, or Firm* — Morgan, Lewis & Bockius LLP

(57) ABSTRACT

Methods and apparatus of engineered dielectric profile for high aspect-ratio (AR) 3D NAND structures. The 3D NAND structures comprise a semiconductor structure having multiple stacked memory tiers comprising 2D arrays of memory cells that are charged using vertical structures formed in the semiconductor structure. The memory tiers comprise wordline layers interposed between isolation layers. The vertical structures, such as memory holes or trenches, have a dielectric (e.g., a tunnel dielectric) formed along sidewalls of holes or trenches having a cross-section profile where a thickness of the dielectric at a bottom wordline layer is thicker than the dielectric thickness for at least a portion of wordline layers above the bottom wordline layer. In one example, formation of the tunnel dielectric employs a sandwich design of engineered profile method in which a selective deposition of dielectric is deposited at the bottom sections of the vertical structures while the rest of the structure is un-altered.

11 Claims, 16 Drawing Sheets

(51) Int. Cl.

| | |
|---|---|
| ***H10B 41/35*** | (2023.01) |
| ***H10B 43/27*** | (2023.01) |
| ***H10B 43/35*** | (2023.01) |
| ***H10B 80/00*** | (2023.01) |
| ***H10W 20/42*** | (2026.01) |
| ***H10W 90/00*** | (2026.01) |
| *H10W 90/20* | (2026.01) |

(52) U.S. Cl.
CPC ............. *H10B 43/27* (2023.02); *H10B 43/35* (2023.02); *H10B 80/00* (2023.02); *H10W 20/42* (2026.01); *H10W 90/00* (2026.01); *H10W 90/297* (2026.01)

(58) Field of Classification Search
CPC ........ H10B 43/35; H10B 43/40; H10B 43/50; H10B 51/00; H10B 51/10; H10B 51/20; H10B 51/30; H10B 51/40; H10B 51/50
See application file for complete search history.

ISOLATION 790
POLY 785
ISOLATION 780
POLY 770
ISOLATION 760
POLY 750
ISOLATION 740
POLY 730
ISOLATION 720
700

CAVITY 791
ISOLATION 790
POLY 785
ISOLATION 780
POLY 770
ISOLATION 760
POLY 750
ISOLATION 740
POLY 730
ISOLATION 720
702

Memory holes
1000
Select Gate

Tunnel
Dielectric
1002
No
Growth
Middle
Transition
Region
Engineered Tunnel Dielectric
(Thicker)
1004
Normal
Growth
Bottom
Select
Gate

ENGINEERED DIELECTRIC PROFILE FOR HIGH ASPECT-RATIO 3D NAND STRUCTURES

BACKGROUND INFORMATION

Three-dimensional (3D) NAND (not AND) technologies are commonly used to create nonvolatile (NV) storage devices, such as solid-state drives (SSDs). Reference to 3D NAND can more specifically refer to NAND flash. Unlike convention 2D memory devices, 3D NAND memory devices have one or more decks comprising tiers of circuit elements that are stacked on top of one another. The circuit elements are connected via channels in vertical structures (e.g., memory holes or pillars) having high depth to width aspect ratios (AR).

Fabricating 3D memory devices having high AR vertical structures poses significant challenges. One problem is as AR increases, it becomes more difficult to deposit and/or grow a dielectric material, such as a tunnel dielectric and/or blocking dielectric, to have sufficient thickness for the NAND cells in the bottom portion of the memory holes compared to the rest of the cells. This often leads to reliability degradation of the cells having thinner dielectric.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
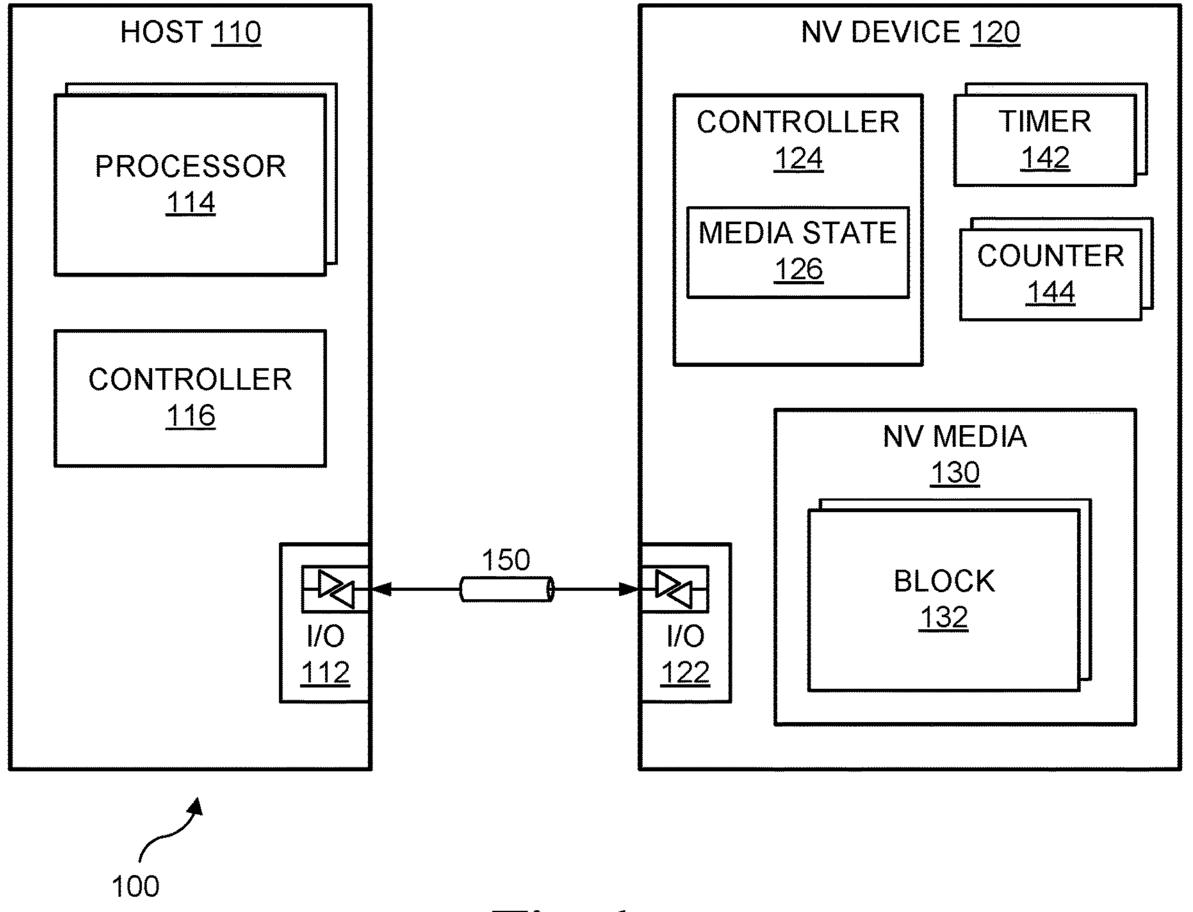
FIG. 1 is a block diagram of an example of a system that stores data in Non-volatile (NV) media.

Embodiments of methods and apparatus for bottom-thick oxide for high aspect-ratio 3D NAND structures are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

FIG. 1 is a block diagram of an example of a system that stores data in Non-volatile (NV) media. System 100 includes host 110 coupled to NV device 120. Host 110 represents a computing device. Host 110 includes I/O (input/output) 112, which represents hardware to interconnect with NV device 120. NV device 120 includes I/O 122 which corresponds to I/O 112. I/O 122 represents hardware to interconnect with host 110.

Host 110 provides a hardware platform to operate NV device 120. Host 110 includes one or more processors 114 to perform the operations of host 110. Processor 114 executes a host operating system (OS) that provides a software platform for the operation of NV device 120. The hardware platform provides hardware resources to interface with NV device 120 including transceiver hardware to perform access to the device. The software platform includes control software to execute other software elements such as applications or other agents that execute under the OS and create requests to access NV device 120.

I/O 112 and I/O 122 interconnect through one or more signal lines 150. Signal lines 150 typically include multiple separate lines and can be considered one or more buses to connect host 110 to NV device 120. Host 110 can send a host read command over signal line 150 to NV device 120. In response to the read command, NV device 120 services the request out of a transient Vt state, in accordance with any example provided.

In one example, host 110 includes controller 116. Controller 116 represents a memory controller or storage controller. In one example, controller 116 is integrated with processor 114. In one example, controller 116 is separate from processor 114. Controller 116 enables host 110 to manage access to NV device 120. In response to host operations by processor 114 that request access to data on NV device 120, controller 116 provides access to NV device 120. Controller 116 can represent hardware and firmware elements of host 110 to enable interaction with NV device 120.

NV device 120 includes controller 124, which represents a storage controller at the side of the storage device, which is separate from controller 116 of host 110. Controller 116 of host 110 represents components of the host system. Controller 124 represents components of the storage device or memory device into which the NV media is incorporated. Controller 124 receives commands sent from host 110 and determines how to service the command or request from the host. Controller 124 performs operations to access (e.g., read or write) NV media 130 in response to the host command.

NV media 130 represents a nonvolatile storage media of NV device 120. In one example, NV media 130 includes three-dimensional (3D) NAND (not AND) memory cells. In one example, NV media 130 includes 3D NOR memory cells. In one example, NV media 130 includes 3D crosspoint (XPOINT™) memory cells.

NV media 130 includes bitcells or memory cells organized as blocks 132. A block of memory refers to a portion of NV media 130 that is jointly charged or activated for an access operation. In one example, blocks 132 are subdivided as subblocks. In one example, a block refers to bitcells that share a select gate line. In one example, multiple subblocks share a select gate (e.g., a common select gate source (SGS) or a common select gate drain (SGD)) connector.

In one example, a block refers to an erase unit, or a unit size of NV media 130 that is erased together and monitored by controller 124 for number of writes. In one example, NV media 130 includes single level cell (SLC) and multilevel cell (MLC) media. For example, NV media 130 can include SLC and QLC (quad level cell) or SLC and TLC (triple level cell) bitcells. The block size could be different depending on the media type.

In one example, controller 124 is an ASIC (application specific integrated circuit) that controls operation of NV device 120. In one example, controller 124 is a CPU (central processing unit) core or processor device on NV device 120. In one example, NV device 120 represents an SSD and controller 124 controls multiple NV media dies or NV media chips integrated into the SSD. In one example, NV device 120 represents a module or PCB (printed circuit board) that includes multiple NV media dies or NV media chips integrated onto it and controller 124 controls the NV media dies of the module. In one example, controller 124 executes firmware to manage NV device 120. In one example, controller 124 executes firmware to manage NV device 120, including firmware to control the servicing of a read command based on whether the NV media is in thermal equilibrium.

In one example, controller 124 manages Vt state detection and read command servicing based on idle time or delay between consecutive read commands. In one example, controller 124 monitors one or more media states 126. Media state 126 represents a state of a portion of memory (such as a block) and can determine how to access the media based on media state 126. For example, if media state 126 indicates that a target block is in a stable state, controller 124 can first issue a dummy read prior to accessing the target block. In one example NV media devices 120 may include one or more timers 142 and counters 144.

Figure 2:
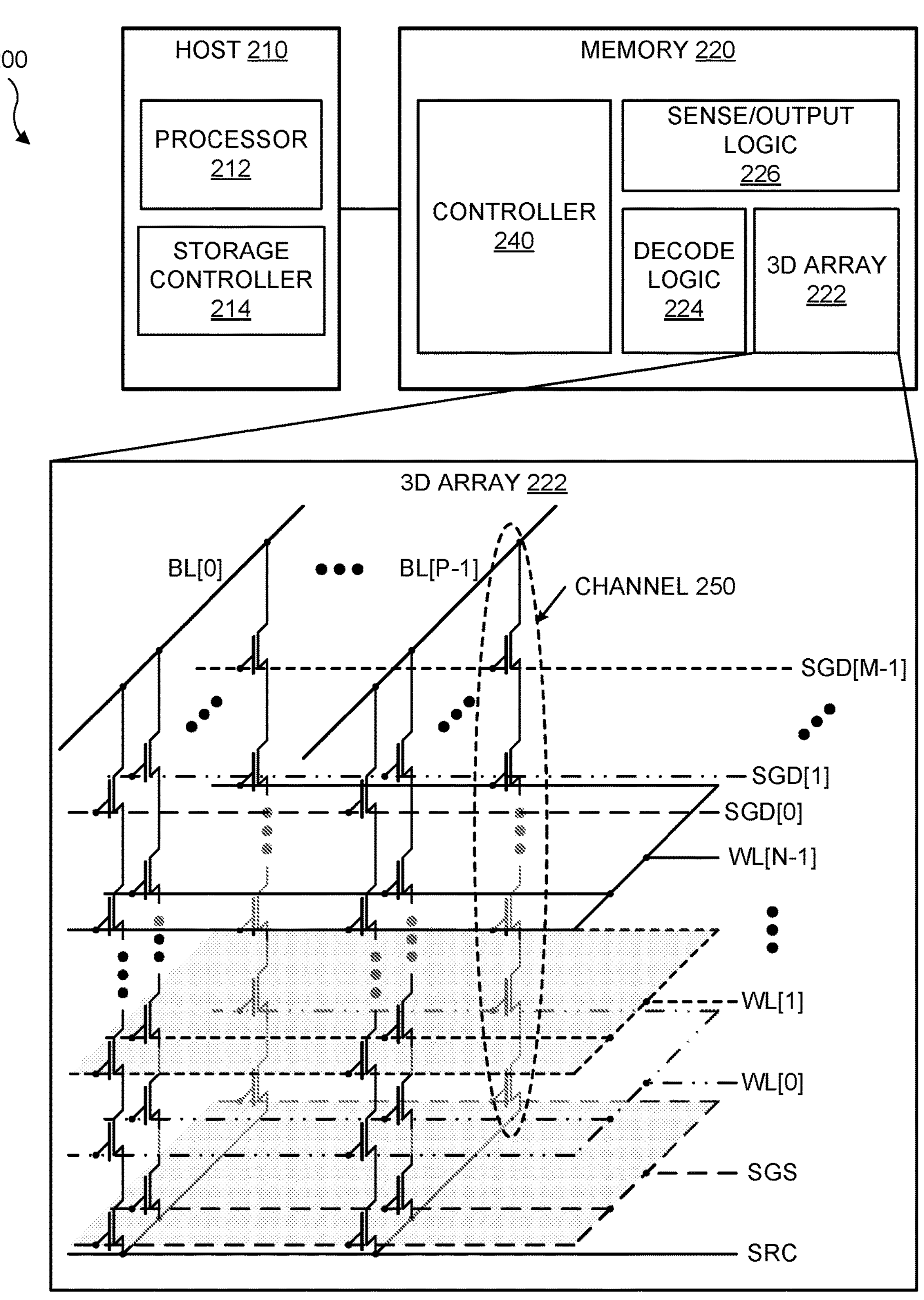
FIG. 2 is a block diagram of an example of system including a three-dimensional (3D) memory device structure.

FIG. 2 is a block diagram of an example system illustrating further details of a 3D memory device structure. System 200 represents a computing device that includes a 3D memory. Host 210 represents a hardware platform that performs operations to control the functions of system 200. Host 210 includes processor 212, which is a host processor that executes the operations of the host. In one example, processor 212 is a single-core processor. In one example, processor 212 is a multicore processor device. Processor 212 can be a general-purpose processor that executes a host operating system or a software platform for system 200. In one example, processor 212 is an application specific processor, a graphics processor, a peripheral processor, or other controller or processing unit on host 210. Processor 212 executes multiple agents or software programs (not specifically shown). The agents can be standalone programs and/or threads, processes, software modules, or other code and data to be operated on by processor 212.

During execution of operations by processor 212, an agent executed by the processor can request data and/or code that is not stored at host 210 (e.g., in a cache or main memory), and therefore should be obtained from memory 220. Storage controller 214 generates and processes memory access commands to memory 220 to perform the memory access. Storage controller 214 represents a circuit or logic or processor that manages access to memory 220. In one example, storage controller 214 is part of host 210. In one example, storage controller 214 is part of processor 212. In one example, storage controller 214 is integrated on a common substrate with processor 212. In one example, storage controller 214 separate chip from processor 212, and can be integrated in a multichip package (MCP) with processor 212.

Memory 220 includes controller 240, which represents a controller at the memory or storage device to process and service commands from storage controller 214. In one example, controller 240 represents a controller for a memory device. In one example, controller 240 represents a controller for a memory module. Memory 220 includes 3D array 222. In one example, 3D array 222 includes NAND memory blocks. In one example, 3D array 222 includes QLC NAND memory blocks.

As illustrated, bitlines (BL) intersect the planes of the tiers of wordlines (WL). As an example, each wordline WL[0:(N−1)] is a tier. There can be P bitlines (BL[0:(P−1)]). In one example, 3D array 222 is also divided into subblocks through SGD[0:(M−1)], which divide each wordline into separate segments within a tier or within a plane of wordlines. Alternatively, SGS can be subdivided to provide subblocks. In such a configuration, whereas SGS is shown to apply to multiple SGD lines, there could be multiple SGS lines to a single SGD line. SRC represents a common source.

Channel 250 represents a vertical channel of the 3D array. The channel refers to a vertical stack of bitcells that can be charged through a channel connector. In one example, the channels couple to the bitline. It will be understood that there can be spatial dependencies in the stable Vt state of a channel. For example, the flow of charge carriers in the channel can be different at the different ends of the channels. Thus, blocks with specific wordlines may show worse degradation than others. The operation of controller 240 to mitigate read disturb due to stable Vt in the channel can be set by thresholds and operation that mitigates the most sensitive of the wordlines.

Each label, WL[0], WL[1], SGD[0], and so forth, indicates a select signal provided by control logic of decode logic 224, or a select signal provided by control logic of sense/output logic 226. In one example, decode logic 224 includes selection logic to select each of the signal lines illustrated. In one example, sense/output logic 226 enables the sensing of the contents of bitcells of 3D array 222, for either a read operation or to write a value back to the array. The output can be for a read operation to send data back to host 210. A write operation would include writing to a buffer to apply the values to the array.

It will be understood that a signal line in 3D array 222 is a wire or trace or other conductor that provides charge from a driver to the various elements or components. A driver circuit decode logic 224 provides the charge to charge up each signal line to the desired voltage for the desired operation. Each signal line can have an associated voltage level associated with certain operations. For example, each wordline can have a select voltage and a deselect voltage to indicate, respectively, wordlines that are selected for an operation and wordlines that are not selected for an operation.

In 3D array 222, it will be understood that the length of the wordlines can be substantial. In one example, the number of tiers of wordlines is on the order of tens or dozens of wordlines (e.g., N=28, 32, 36, 70, or more). In one example, the number of subblocks is on the order of ones or tens (e.g., M=8, 76, or more). Typically, the number of bitlines in 3D array 222 will be on the order of hundreds to thousands (e.g., P=2K). Thus, in one example, each bitline is relatively short compared to the length of the wordlines.

Figure 3:
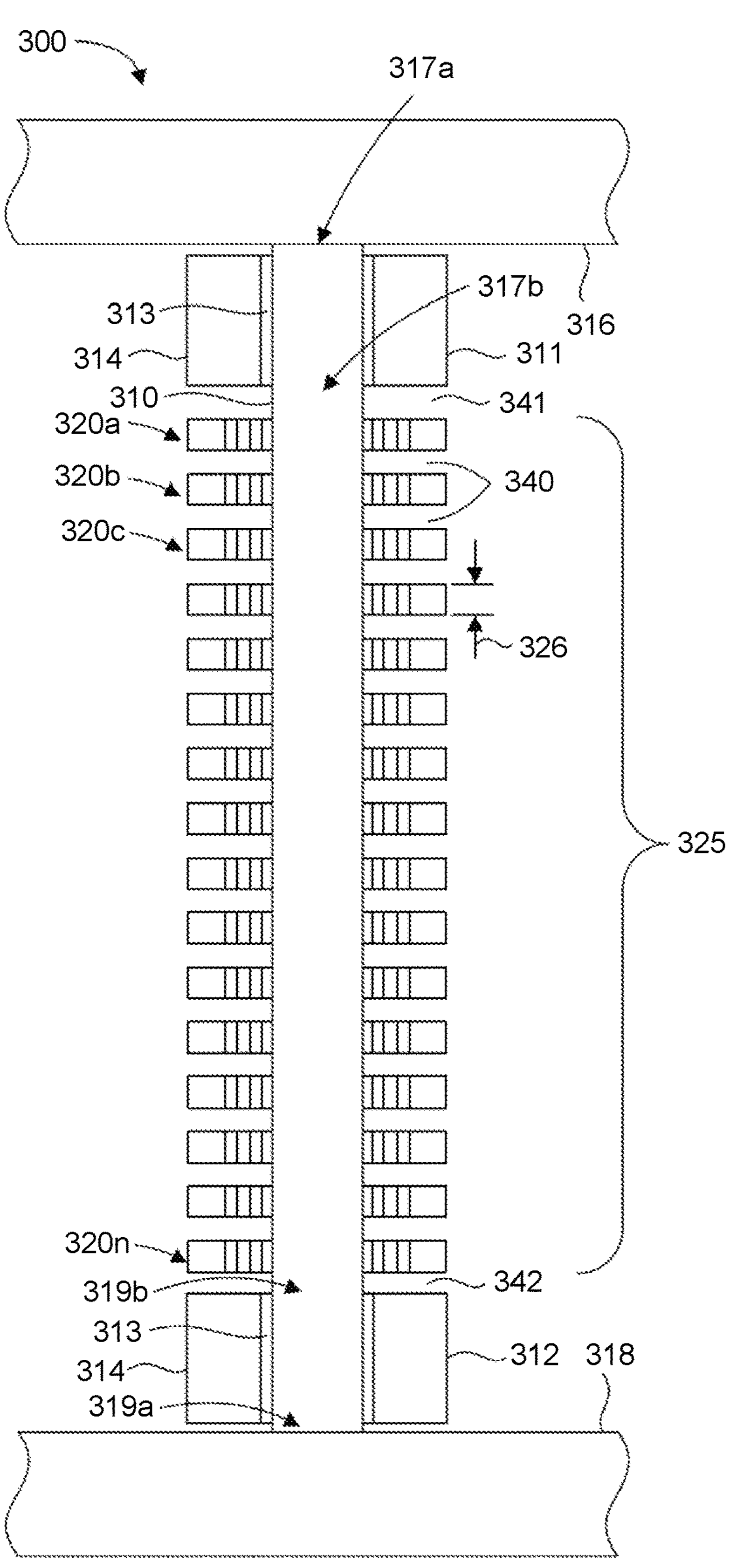
FIG. 3 is a diagram illustrating an abstracted representation of a portion of a solid-state memory component, according to one example.

FIG. 3 shows an abstracted representation of a portion of a solid-state memory component 300, according to one example. In general, the portion of the solid-state memory component includes a memory pillar 310 and memory cells 320*a-n* (i.e., a string 325 of memory cells, such as a NAND string) located adjacent to the memory pillar 310. Memory pillar 310 may also be referred to as a "memory hole" in some embodiments. Any suitable number of memory cells can be included. The memory pillar 310 can act as a channel region for the memory cells 320*a-n*, which can be coupled in series. For example, during operation of one or more of the memory cells 320*a-n* of the string, a channel can be formed in the memory pillar 310. The memory pillar 310 and the string of memory cells 320*a-n* can be oriented vertically, such as in a three-dimensional memory array. For example, memory cell 320*a* is located at a vertical level (e.g., near the top of the memory array) that is above a vertical level (e.g., near the bottom of the memory array) at which memory cell 320*n* is located. Generally, memory cells 320*a-n* can have any suitable structure. A simplified memory cell structure is provided for context and by way of an example. Therefore, it should be recognized that suitable memory cell structures can vary from the memory cell structure shown in FIG. 3.

Figure 4:
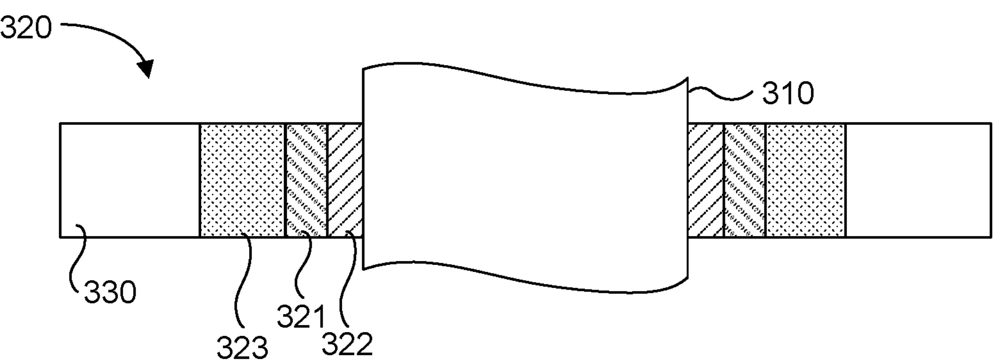
FIG. 4 is a diagram illustrating a simplified structure of a memory cell implemented in the solid-state memory component of FIG. 3.

Each memory cell 320*a-n* in this example can have a charge-storage structure (e.g., that may be a conductive floating gate, a dielectric charge trap, etc.). For example, as shown in FIG. 4, which illustrates a cross-section side view, memory pillar 310 and a representative memory cell 320, the memory cell 320 can have a charge-storage structure 321. Each memory cell 320*a-n* can also have a tunnel dielectric interposed between its charge-storage structure and the memory pillar 310. For example, the memory cell 320 can have a tunnel dielectric 313 interposed between the charge-storage structure 321 and the memory pillar 310. In addition, each memory cell 320*a-n* can have a control gate (e.g., as a portion of or coupled to access lines, such as word lines). For example, the memory cell 320 can include a control gate 330. Each memory cell can have one or more dielectric materials or dielectric layers interposed between its charge-storage structure and the control gate. For example, the memory cell 320 can include dielectric layer 323 interposed between the charge-storage structure 321 and the control gate 330 referred elsewhere in the text as inter-poly dielectric (IPD).

Each memory cell 320 may be a non-volatile memory cell and may have a charge-storage structure 321, such as a floating gate that may be a semiconductor (e.g., polysilicon), a charge trap layer that may be a dielectric film, etc. Non-limiting examples of dielectrics that are suitable for charge traps include nitrides, high-dielectric constant (high-K) dielectrics, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$. Embodiments of floating-gate and charge trap cells are described and illustrated below.

With further reference to FIG. 3, a dielectric 340 (also called an isolation layer) may be interposed between successively adjacent memory cells 320*a-n* in the string 325. For example, a dielectric 340 may be interposed between at least the charge-storage structure 321, the dielectric 323 and the control gates 330 of successively adjacent memory cells 320*a-n*. A dielectric 341 may be interposed between an end (e.g., between memory cell 320*a*) of the string 325 and the select gate 311, and a dielectric 342 may be interposed between an opposite end (e.g., between memory cell 320*n*) of the string 325 and the select gate 312, as shown in FIG. 4.

In some embodiments, where the charge-storage structure 321 is a charge trap, the tunnel dielectric 322, the charge-storage structure 321, and the dielectric 323 can form a continuous structure that can be shared by (e.g., that may be common to) two or more of the memory cells 320*a-n*. For example, such a structure can be shared by or common to all of the memory cells 320*a-n*.

Each of the memory cells 320*a-n* can have a thickness (e.g., a channel length) 326. For example, the memory cells 320*a-n* can have the same channel length regardless of where in string 325 the memory cells are located. In some embodiments, at least one channel length of a memory cell can be different from another channel length of another memory cell.

Each memory cell 320*a*-*n* of the string 325 can be coupled in series with and can be between a select gate (e.g., a drain select gate) 311 adjacent to (e.g., in contact with) the pillar 310 and a select gate (e.g., a source select gate) 312 adjacent to (e.g., in contact with) the pillar 310. For a functional memory pillar, the pillar 310 is electrically coupled to a data line (e.g., a bit line 316), indicated at 317*a* and 317*b*. Thus, the select gate 311 can selectively couple the string 325 to the data line (e.g., the bit line 316). In addition, for a functional memory pillar, the pillar 310 is electrically coupled to a source line 318, indicated at 319*a* and 319*b*. Thus, the select gate 312 can selectively couple the string 325 to the source line 318. For example, the select gate 311 can be coupled in series with memory cell 320*a*, and the select gate 312 can be coupled in series with memory cell 320*n*. The select gates 311 and 312 can each include a gate dielectric 313 adjacent to (e.g., in contact with) pillar 310 and a control gate 314 adjacent to (e.g., in contact with) a corresponding gate dielectric 313.

Figure 5:
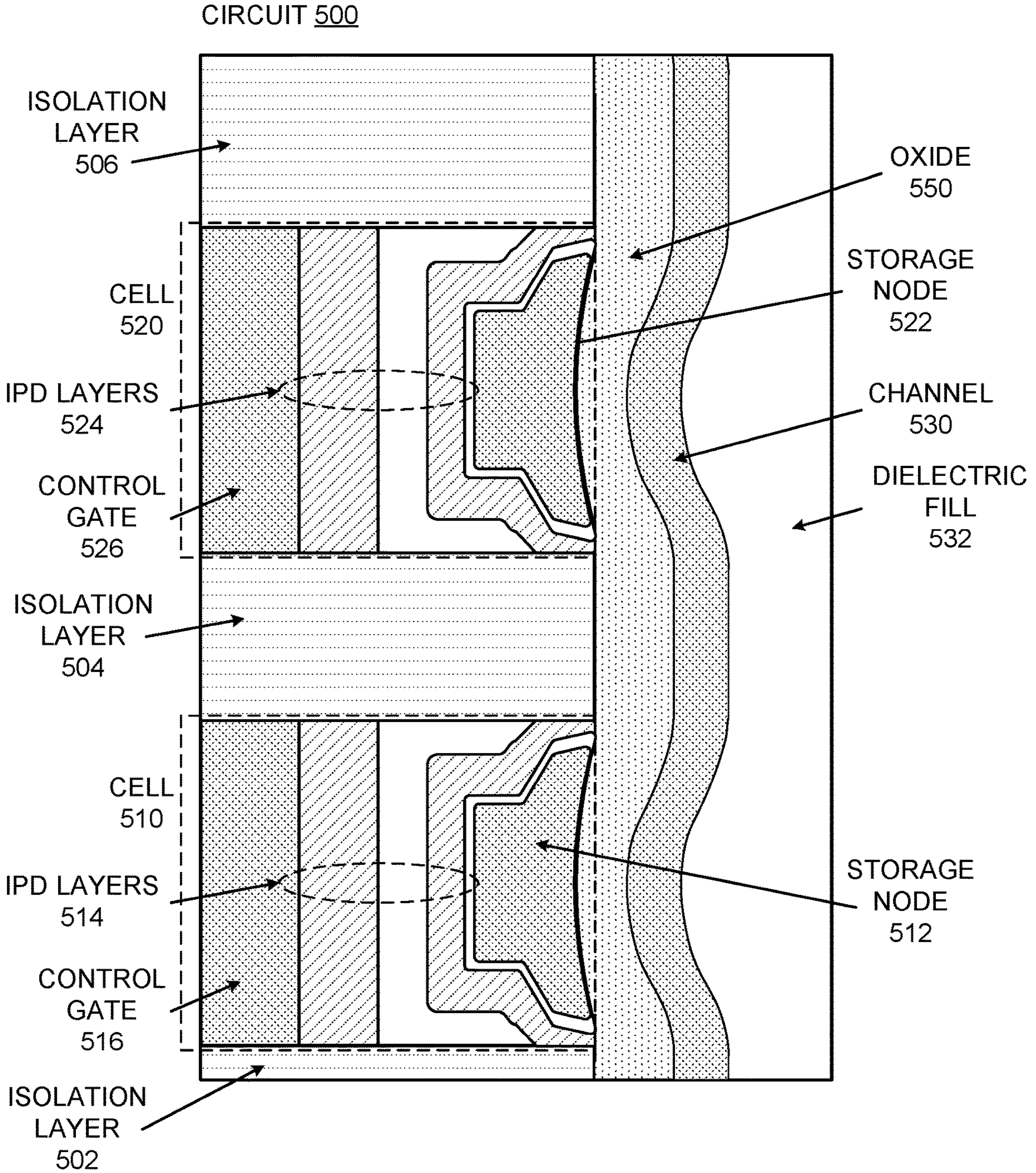
FIG. 5 is a diagram representing a cross-section view of a portion of a vertical channel in a 3D memory structure, according to one embodiment.

FIG. 5 shows a circuit 500 that represents a portion of a vertical channel in a 3D memory structure, such as a 3D NAND array. Circuit 500 is not necessarily to scale and illustrates non-limiting example of features rather than providing an exact representation of features. Also, the shape of some of the cell structures are simplified for illustrative purposes.

Circuit 500 depicts two memory cells, cell 510 and cell 520 and three isolation layers 502, 504, and 506 (which may also be called separation layers). Although circuit 500 is not necessarily to scale, the isolation layers between the cells are generally thinner than the cells themselves. The cells illustrate one example of a memory cell structure, with semiconductor indicated as storage node 512 and storage node 522, respectively. Storage node 512 is separated from control gate poly by one or more IPD (inter-poly dielectric) layers 514. The conductor layer poly is a layer of conductor to control access to the storage node. The conductor layer poly for storage node 512 is represented as control gate 516. Likewise, storage node 522 is separated from conductor layer poly by one or more IPD layers 524, represented as control gate 526. The number of IPD layer and the structure of those layers is not important for circuit 500, as long as the storage node is electrically isolated from the conductor layer.

In one example, circuit 500 includes channel conductor 530 with a dielectric fill 532. 3D NAND typically uses polycrystalline (poly) material for channel 530, such as but not limited to polycrystalline silicon (also referred to as polysilicon). In one example, channel 530 may be p-type or n-type doped poly.

FIGS. 3 and 4 illustrate examples of ideal structures in which memory holes/pillars have perfectly straight sidewalls (i.e., constant diameter) and the thicknesses of dielectric layers remain the same from the top to the bottom of the memory holes/pillars. The aspect ratios (height to width or hole depth to hole diameter) are reduced in FIG. 3 for illustrative purposes and clarity—the aspect ratio in actual devices is greater, such as shown in some of the following Figures.

Generally, it is not possible or practical to form memory holes with high aspect ratios that have perfectly straight sidewalls. Rather, the memory holes have a slight amount of taper, with the diameter at the top of the memory hole being slightly greater than the diameter at the bottom. Likewise, the thickness of dielectric materials formed on the sidewalls of the memory holes also varies slightly from top to bottom.

Figure 6A:
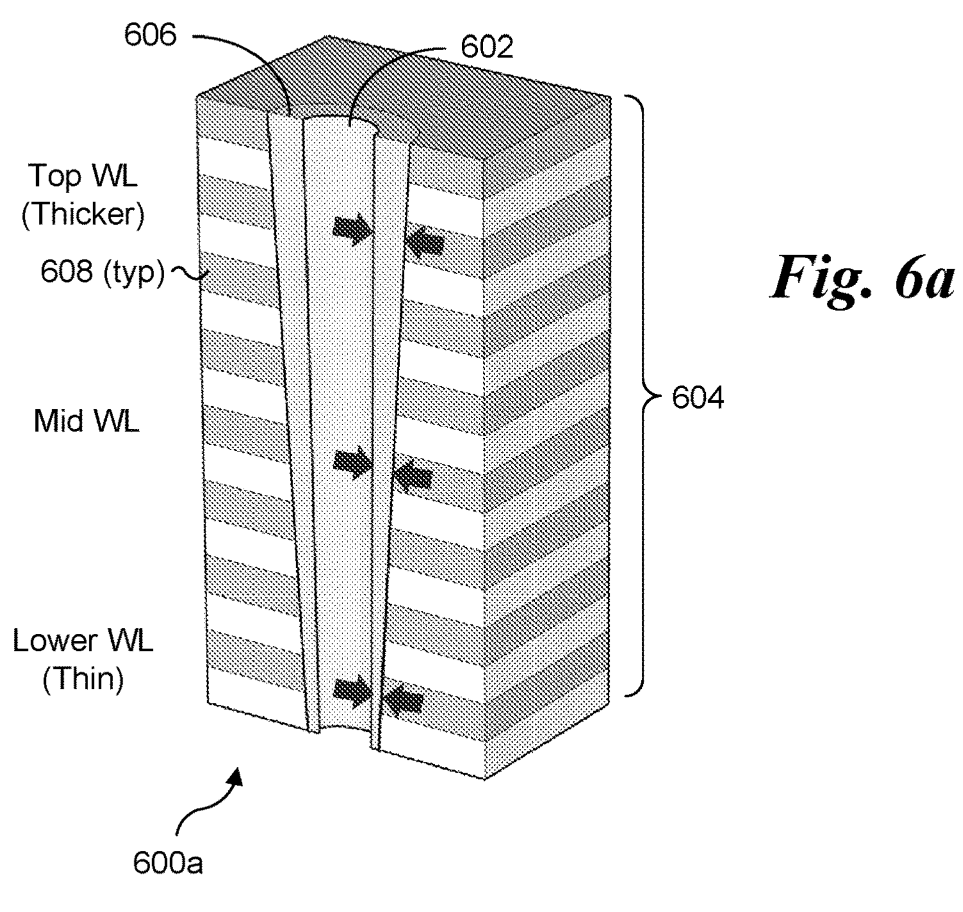
FIG. 6*a* shows an isometric cross-section view of an abstracted representation of a semiconductor structure in which a memory hole is formed through a deck 604 of memory tiers, and wherein the thickness of a dielectric material formed over the sidewalls of the memory hole reduced for the lower wordlines.

This problem is pictorially illustrated in diagram 600*a* in FIG. 6*a*, which shows an abstracted representation of a semiconductor structure in which a memory hole 602 is formed through a deck 604 of memory tiers. A dielectric material 606 is formed on the sidewalls of memory hole 602. As illustrated, both memory hole 602 and dielectric material 606 have a tapered profile (exaggerated in diagram 600*a* for clarity). More significantly, the cross-section width of dielectric material 606 becomes narrower from top to bottom.

The gray layers in diagram 600*a* represent memory tiers in which circuit elements including wordlines (WL) 608 are formed, while the white layers represent layers used to separate the memory tiers (e.g., isolation or separation layers). The thickness of dielectric material 606 is thicker for the wordlines towards the top of memory hole 602 and thinner for the lower wordlines. The thinner dielectric material (e.g., oxide) on lower WLs is attributable to a fundamental process capability limitation i.e., reduction of oxidation species transport/limitation of reaction rate at the bottom of the memory hole to create such dielectric film in high aspect ratio structures. Therefore, as the aspect-ratio of the memory hole increases, the thickness of the dielectric film deposited at the bottom of the structure becomes a critically important parameter which is directly proportional to the reliability of memory cells on the lower wordlines, typically after a threshold amount of program-erase cycles of the memory product.

To address this thinning dielectric problem for high aspect ratio memory holes, The proposed method produces an engineered bottom-thick dielectric profile under which the thickness and quality of the dielectric remains substantially the same for wordlines from the top to the bottom of the memory holes. Thus, overcoming the aspect-ratio dependent step-coverage trade-off limitation.

Figure 6B:
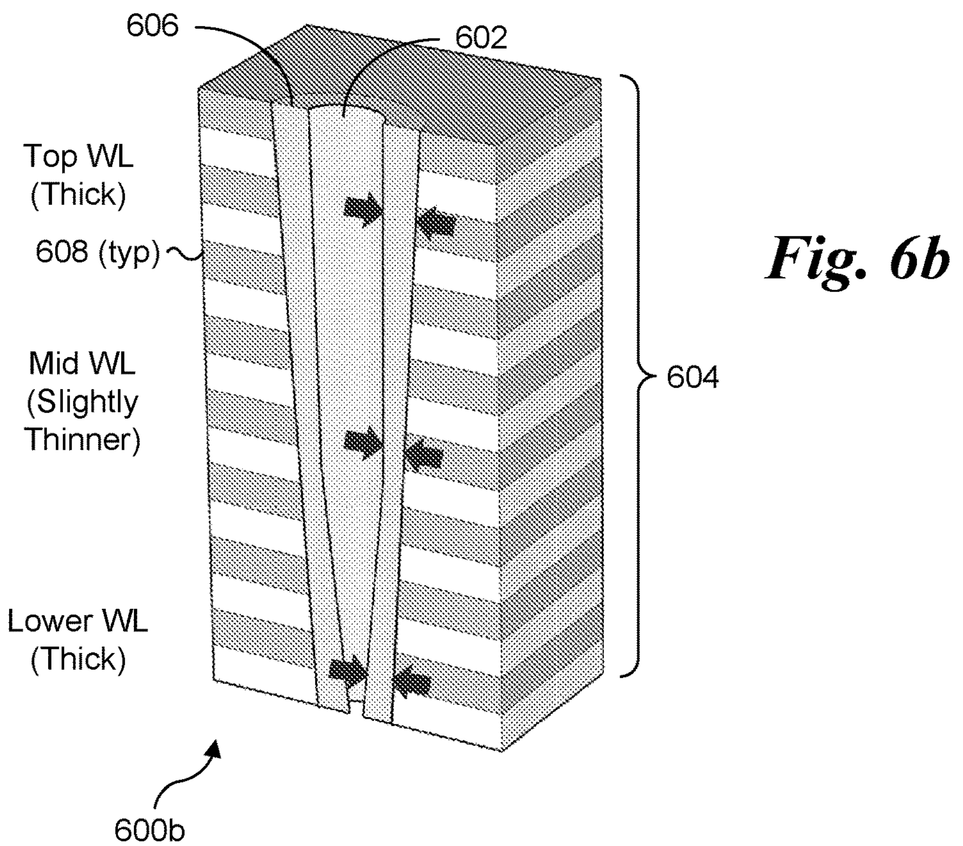
FIG. 6*b* shows an isometric cross-section view of an abstracted representation of a semiconductor structure having an engineered dielectric profile under which the thickness of the dielectric remains substantially the same for wordlines from the top to the bottom of the memory holes.

An example of an application of this approach is shown in diagram 600*b* in FIG. 6*b*. As shown, the width of dielectric material 606 is (substantially) matched for both the top wordline and the lower wordline, while the width of dielectric material 606 in the middle wordlines is slightly reduced relative to the top and lower wordlines.

FIGS. 7*a*-7*h* are diagrammatic representations of a cross-section of stages of processing of a 3D memory structure employing an engineered dielectric profile, according to one embodiment. For purposes of example, FIGS. 7*a*-7*h* illustrate the processing to create a vertical channel with low resistance regions in recesses along the channel. The circuit states illustrated in FIGS. 7*a*-7*h* can apply to any example 3D memory structure, such as but not limited to circuit 500. The processing is illustrated only for a few layers of a 3D array. The processing will be understood to apply to other layers of the 3D array. The drawings are for purposes of discussion and are not necessarily to scale.

Figures 7A, 7B:
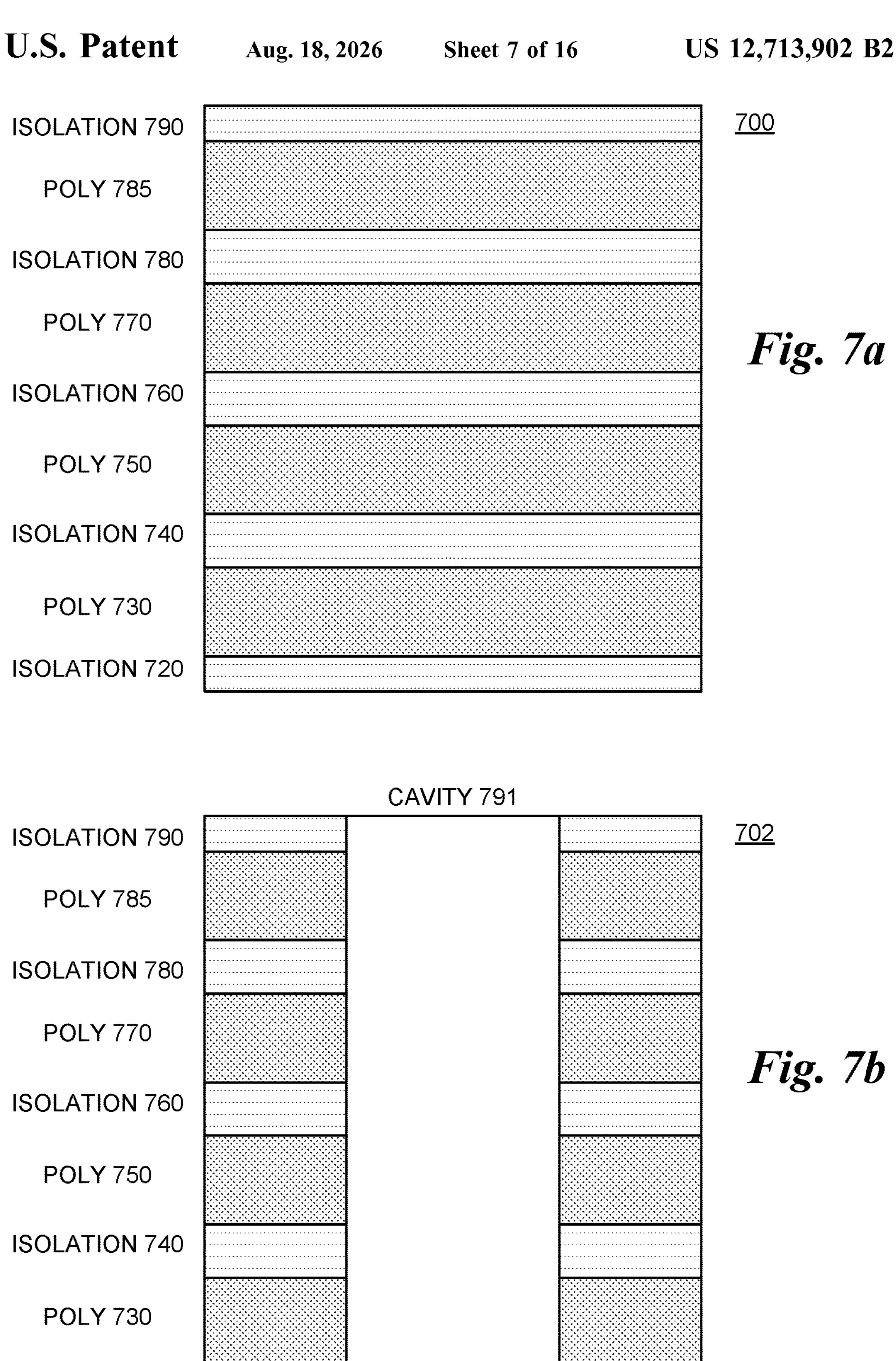
FIG. 7*a*-7*h* are diagrammatic representations of a cross-section of stages of processing of a 3D memory structure, according to one embodiment.

FIG. 7*a* illustrates circuit state 700, with layers of a 3D array being formed in a vertical stack. Circuit state 700 illustrates a portion of an entire vertical stack or vertically stacked layers of a storage array, where the substrate or wafer on which the circuit is formed is not shown. Other layers regarding selectors are also not shown. The stack can have dozens of layers of conductor and isolation layers.

Poly 730 represents a layer of conductor for a memory cell. Isolation layer 720 represents an electrical isolation layer between the conductor of poly 730 and layers below it (not shown). Circuit state 700 also shows poly 750, poly 770, and poly 785, which are conductor layers, and isolation

740, isolation 760, isolation 780, and isolation 790, alternating between the conductor layers. In one example, the conductor layers are layers of highly-doped polysilicon. In one example, the isolation layers are dielectric layers (e.g., Silicon Oxide). In one example, the isolation layers can be or include a nitride material.

FIG. 7*b* illustrates circuit state 702, in which the processing etches or removes a portion of the layers. The resulting etched isolation layer is represented as cavity 791. Cavity 791 represents a vertical cavity or vertical opening through the layers of conductor and isolation. For example, cavity 791 can be formed through an etch operation that forms holes in the 3D array structure. The etch can be performed in stages to achieve a vertical channel cut into the 3D array, recognizing the sidewalls of the channel will not be perfectly vertical due to process limitations, as illustrated in FIGS. 6*a* and 6*b*.

Figure 7C:
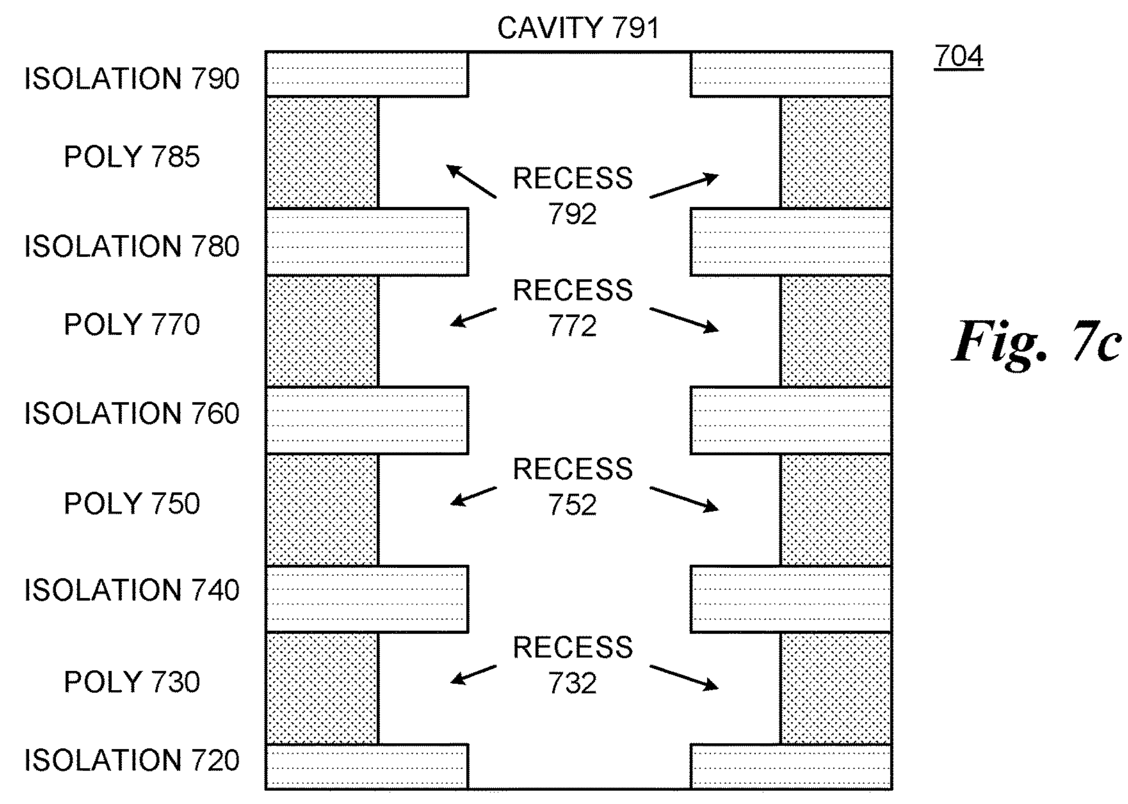

FIG. 7*c* illustrates circuit state 704, in which the processing removes more material from the poly layers. The recesses created are illustrated as recess 732 for layer poly 730, recess 752 for layer poly 750, recess 772 for layer poly 770, and recess 792 to poly 785. The recesses are formed from cavity 791 into the poly layers and between the isolation layers. The depth of the recess can be controlled by a selective etch that etches the poly conductor and not the isolation material. The recess extends away from a center of cavity 791 and will thus extend away from the vertical channel to be formed. The recess can extend away from the center of cavity 791 toward respective control gates of the memory cells, or the control gates that control access to the storage nodes. The depth of the recesses depends on the structure of the storage node to be formed for the memory cells. Circuit state 704 illustrates recesses on both sides of cavity 791. It will be understood that cavity 791 is a three-dimensional structure, such as a vertical cylinder or circular column, whereas the view only illustrates a two-dimensional cutaway view.

Figure 7D:
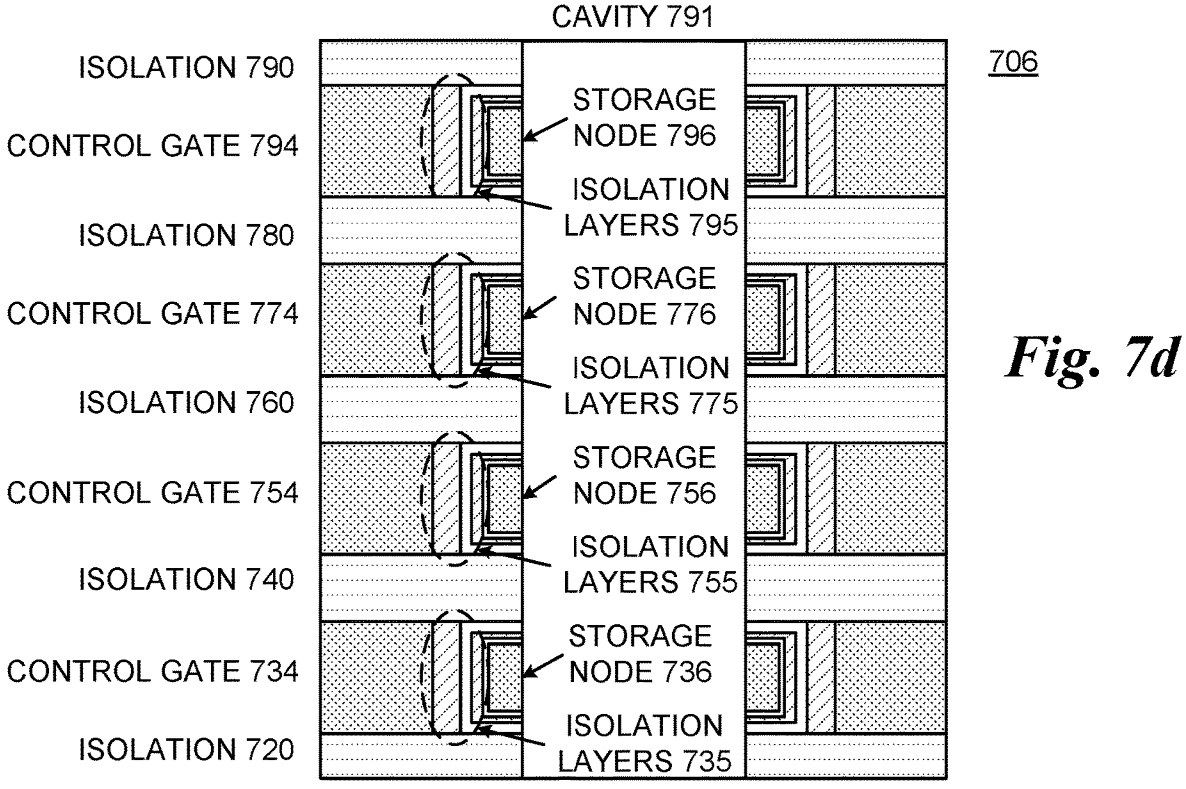

FIG. 7*d* illustrates circuit state 706, in which the processing forms material in the exposed areas for memory cell storage. Storage node 736 represents a storage region for layer poly 730, which is identified in circuit state 706 as control gate 734. The poly layer is the control gate for storage node 736, to control access to the storage element. Isolation layers 735 represent one or more layers of isolation material to isolate the conductor of control gate 734 from the conductor of storage node 736. Storage node 756 represents a storage region for layer poly 750, which is identified as control gate 754. The poly layer is the control gate for storage node 756, to control access to the storage element. Isolation layers 755 represent one or more layers of isolation material to isolate the conductor of control gate 754 from the conductor of storage node 756. Storage node 776 represents a storage region for layer poly 770, which is identified as control gate 774. The poly layer is the control gate for storage node 776, to control access to the storage element. Isolation layers 775 represent one or more layers of isolation material to isolate the conductor of control gate 774 from the conductor of storage node 776. Storage node 796 represents a storage region for layer poly 785, which is identified as control gate 794. The poly layer is the control gate for storage node 796, to control access to the storage element. Isolation layers 795 represent one or more layers of isolation material to isolate the conductor of control gate 794 from the conductor of storage node 796. It will be understood that the various storage nodes will be formed in parallel. The formation of the storage nodes can include multiple processing operations that occur in series. The structure of the storage nodes is not necessarily exactly as shown. In one example, the storage nodes represent floating gates. In another example, the storage nodes represent charge trap layer. Models of floating gate cells and charge trap cells showing further details of the internal structure of the memory cells are presented below. After the storage node is formed, a dielectric film may be deposited or grown out of storage node which forms the tunnel dielectric 725 as shown in FIG. 7*e*.

Figure 7E:
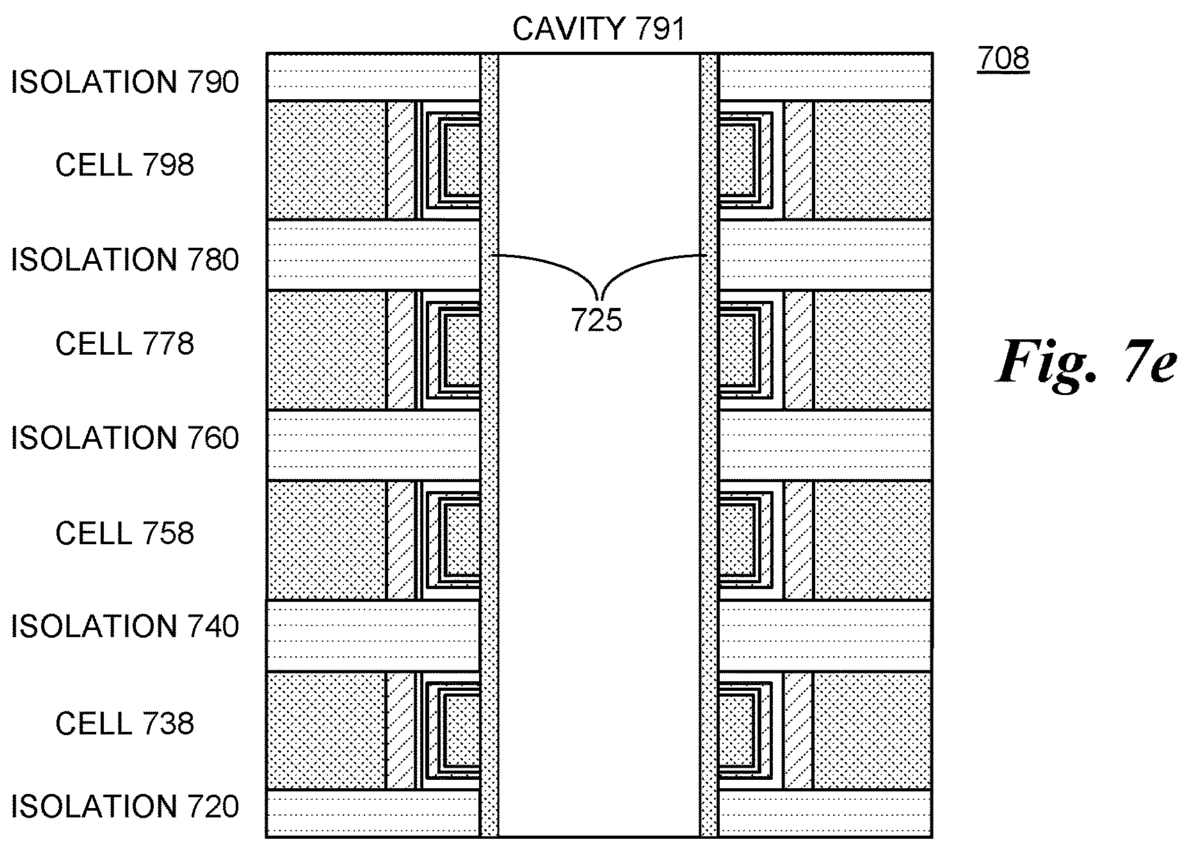
Figure 7F:
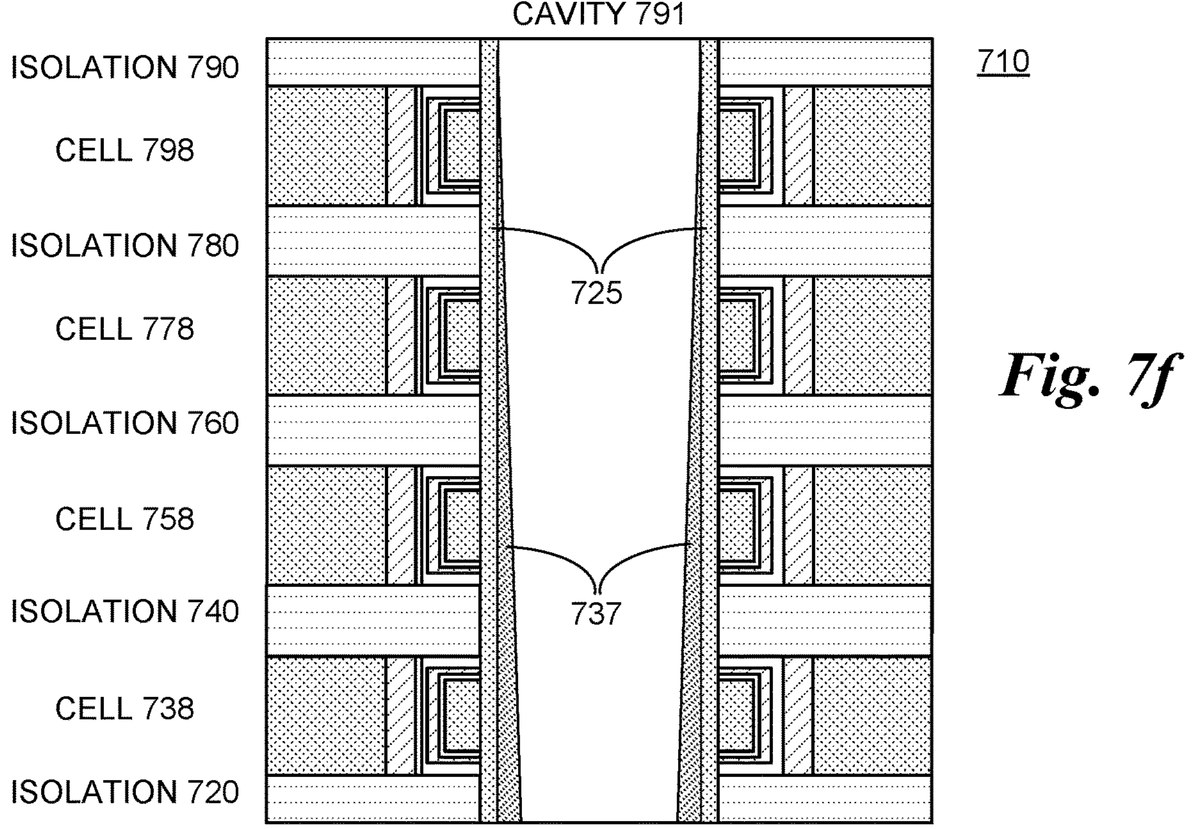
Figure 7G:
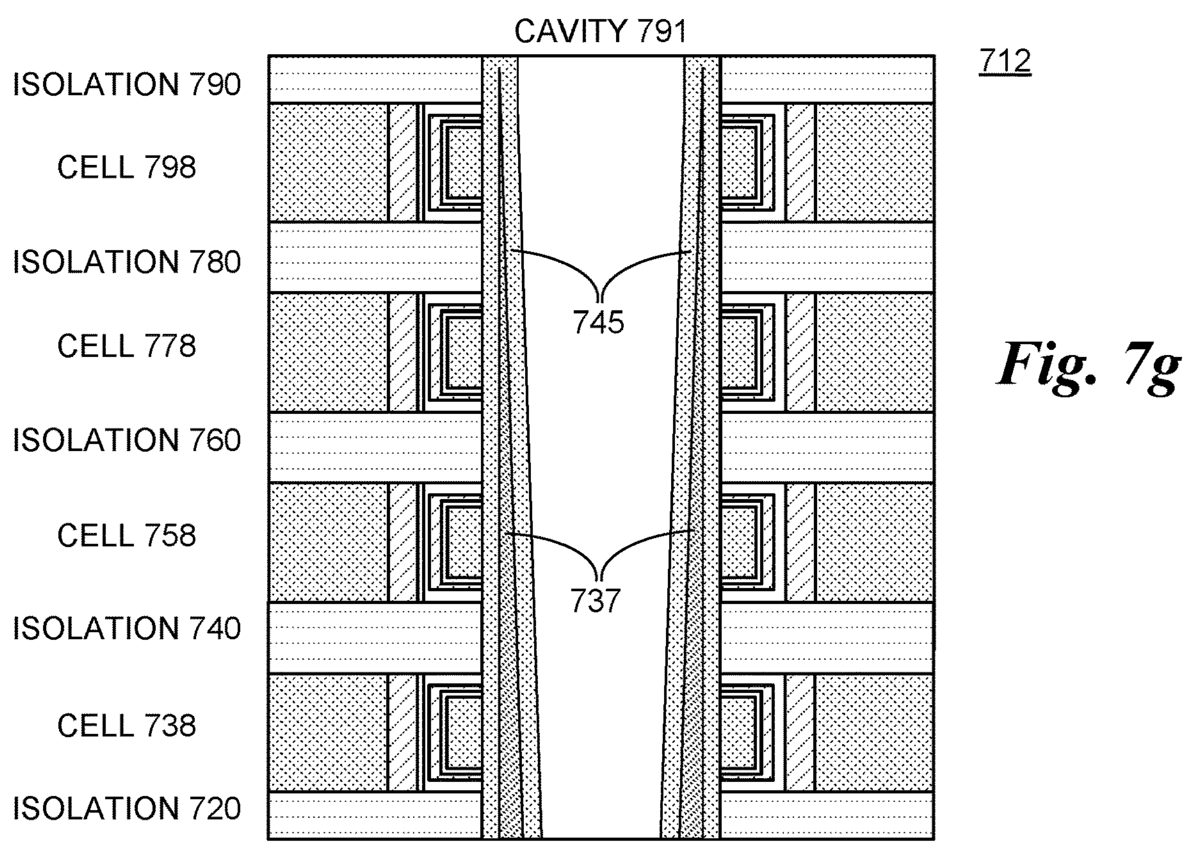

FIG. 7*e* illustrates circuit state 708, in which the processing can remove material from the isolation layers. The poly layers including the gates and storage nodes are represented in circuit state 708 as memory cells 738, 758, 778, and 798.

Figure 8:
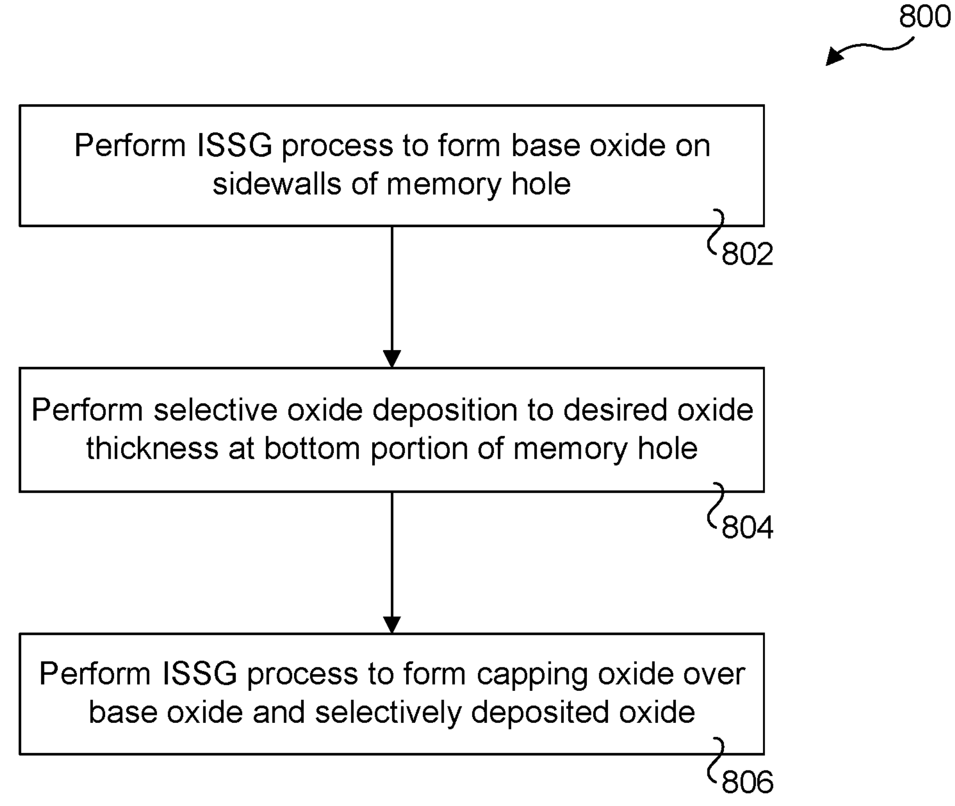
FIG. 8 is a flowchart illustrating top-level operations for fabricating an oxide with a BTO profile, according to one embodiment.
Figure 9:
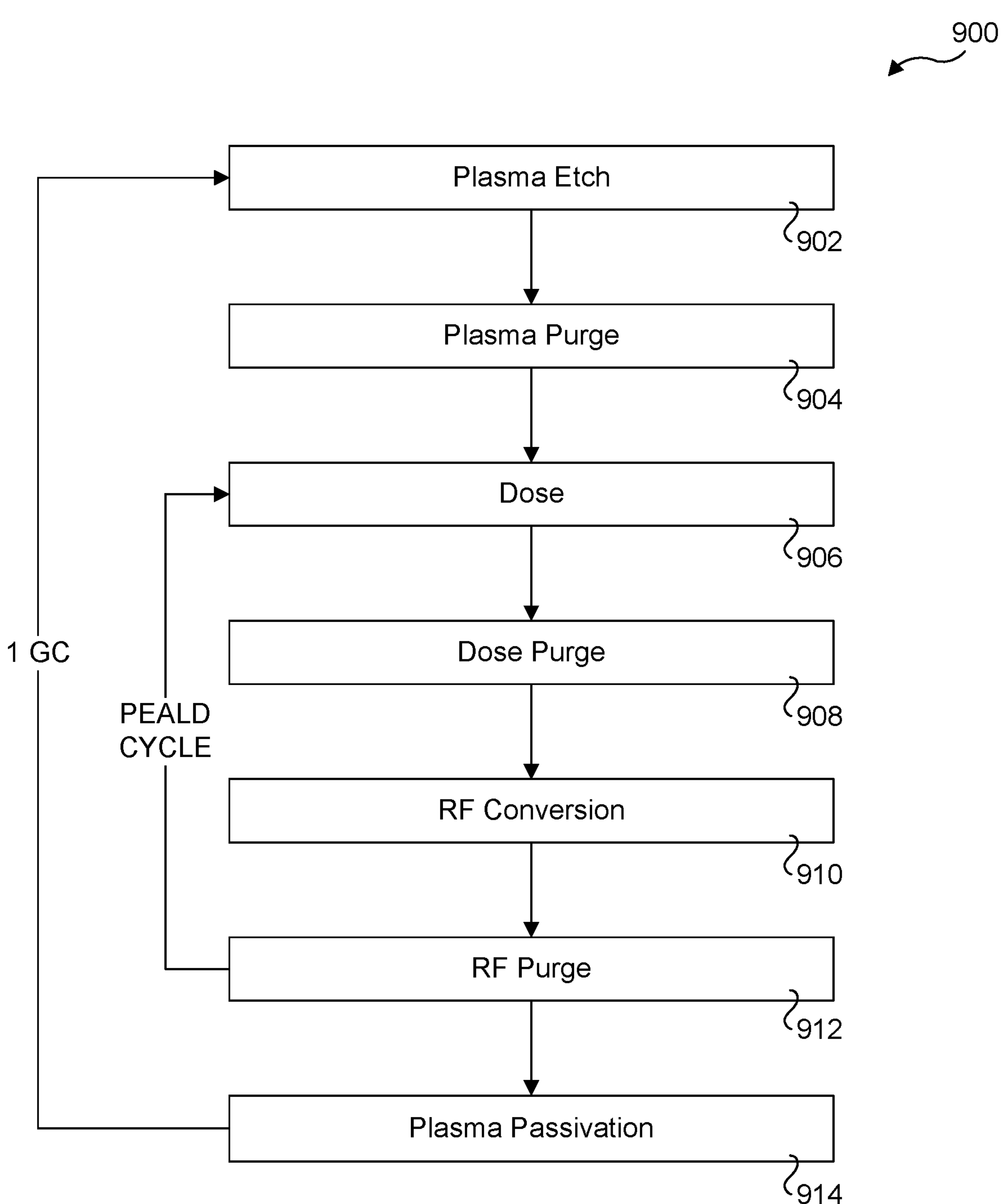
FIG. 9 is a flowchart illustrating detailed operations for performing selective oxide deposition, according to one embodiment.

As discussed above, an engineered dielectric profile approach is used to increase the thickness of the tunnel dielectric film at the bottom portion of the memory holes. With reference to the circuit states illustrated in FIGS. 7*e*-7*g*, and the flowcharts 800 and 900 in FIGS. 8 and 9 the proposed method is implemented as follows, according to one embodiment.

The top-level flow is shown in flowchart 800, beginning with performing an in-situ steam generation (ISSG) oxidation process to form a base dielectric film on the sidewalls of the memory hole, as depicted in block 802 and FIG. 7*e*. This base dielectric film acts as a structural barrier before the selective oxide (in block 804) is deposited at the bottom of the memory hole, thereby protecting the underlying floating gate cell films from potential precursor contamination during subsequent processes. Circuit state 708 and FIG. 7*e* illustrates the circuit state after a base dielectric film 725 has been formed. Generally, the thickness of this base dielectric film 725 is exaggerated for illustrative purposes; in practice, base dielectric film 725 may be on the order of 4 nm-6 nm.

Next, in block 804 selective dielectric film deposition is performed. As shown in circuit state 710 in FIG. 7*f*, an inhibitor-based deposition process is used to deposit the selectively deposited dielectric film 737 at a desired thickness selectively at the bottom portion without disturbing the remaining portions of the memory hole. Further details of the selective deposition process are shown in flowchart 900 in FIG. 9 and discussed below. As will be explained below, in practice, the thickness of this selective dielectric film will gradually increase from a starting point which may be selected as the middle portion of the memory hole and towards the bottom of the hole. For illustrative purposes, this gradual increase is exaggerated in FIGS. 7*f*-7*h*, as is the thickness of the selectively deposited dielectric film. Also, in one embodiment base dielectric film 725 and selectively deposited dielectric film 737 comprise the same material—for illustrative purposes, selectively deposited dielectric film 737 is shown with a different crosshatch pattern in FIGS. 7*f* and 7*g*.

Figure 7H:
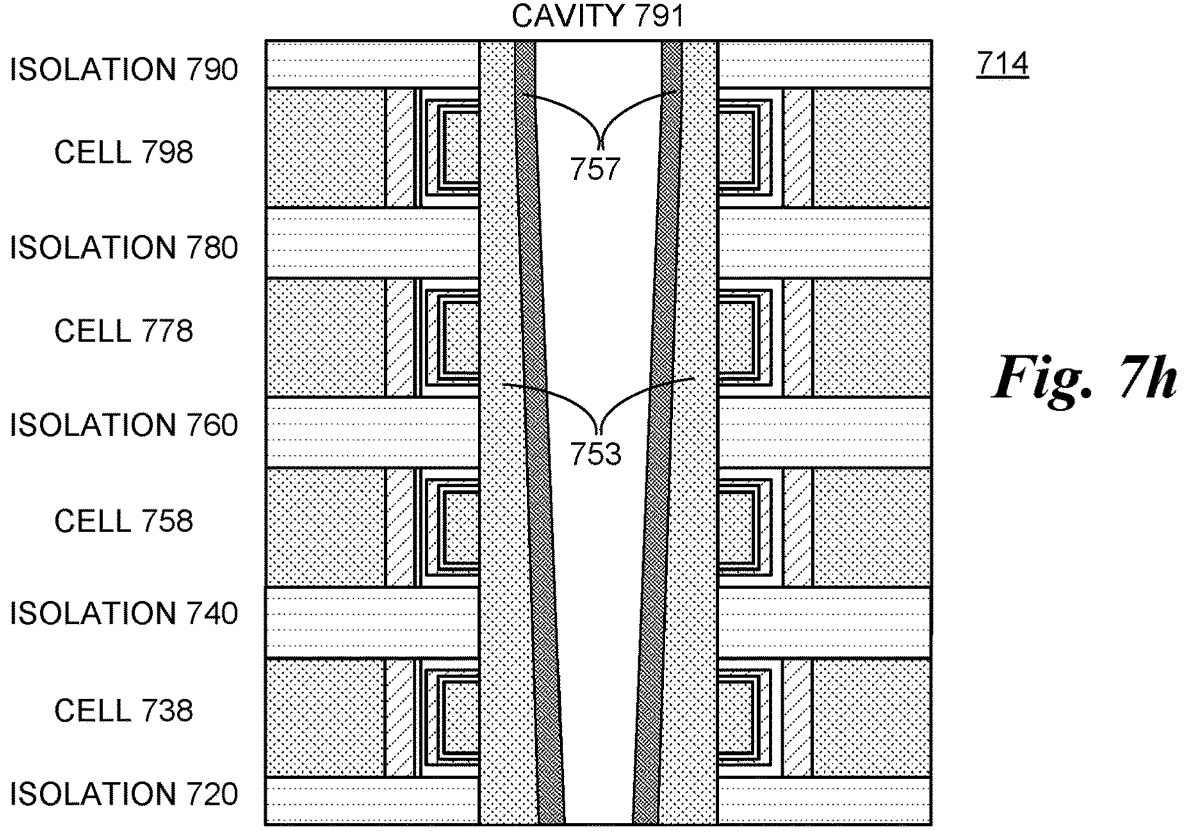

The third step in the top-level process flow is to perform an ISSG oxidation to form a capping dielectric over the base dielectric and the selectively deposited dielectric films, as shown in block 806. This is graphically illustrated by the addition of capping dielectric film 745 in circuit state 712 in FIG. 7*g*. Since ISSG is used for both the base dielectric and the capping dielectric films, the cross-section of capping film 745 does not show a layer separation line, but rather the base dielectric film 725 and capping dielectric film 745 are shown as a single dielectric material. Moreover, as shown in FIG. 7*h*, base dielectric film 725, selectively deposited dielectric film 737 and capping dielectric film 745 are depicted as being blended together (since they are the same material) to form tunnel dielectric film 753 having the illustrated profile. This capping process is necessary to optimize the electrical quality of the selectively deposited dielectric film as ISSG oxidation acts as a healing process to densify the film and remove any potential contaminants trapped inside the film. Typically, ISSG oxidation processes may occur between 800 C-1000 C for optimum dielectric quality. Similar to the base dielectric film, the thickness of the capping dielectric film may be ~2 nm-5 nm. Thus, the total thickness of all the three steps combined will form as the tunnel dielectric film for the 3D NAND memory cells.

Moving to flowchart 900, explains the selective deposition process which includes two loops. The outer loop is referred to as a group cycle (GC), which may be performed one or more times based on the desired film thickness to be deposited. The inner loop is referred to as a PEALD (plasma-enhanced atomic layer deposition) cycles where the actual pre-cursor gases react under a plasma to create a monolayer of dielectric film per each cycle, which is repeated multiple times per group cycle.

The group cycle begins with a plasma etch in block 902, followed by a plasma purge in block 904. In one embodiment, the plasma etch employs nitrogen trifluoride ($NF_3$). The selective deposition process capability is a tailored Atomic Layer Deposition (ALD) process to selectively deposit an ultra-thin dielectric film (thickness ~0.4-3 nm) at the bottom of the memory hole while the film deposition is inhibited on the top regions of the memory holes. The $NF_3$ inhibits ALD growth by blocking precursor adsorption on the upper portion of the memory holes, thus enabling preferential deposition of dielectric film at the bottom portion of the memory holes. The effectiveness of the plasma etch varies with depth, having a greater effect for the upper portion of the memory holes. The inhibition and deposition in the transition region (middle depth portion of the memory hole) leads to a gradual thickness profile increase of the film which mimics the conventional dielectric thickness profile taper effect, such as illustrated in FIG. 7*b*.

The PEALD cycle includes a dose operation, a dose purge, a radio frequency (RF) conversion, and an RF purge, as respectively depicted in blocks 906, 908, 910, and 912. The dose operation refers to flowing/injecting a precursor onto the surface of the memory hole walls to cause precursor absorption. In one embodiment, the dose operation uses t-butyl amino silane (also known as BTBAS), noting other compounds having similar properties may be used, but not limited to other amino silanes. During dose purge, an inert gas (e.g., nitrogen) is introduced to purge out excess precursor. The RF conversion and RF purge operations employ RF plasma cycling and purging. For example, in one embodiment RF plasma cycling uses oxygen as a reactant that reacts with the precursor to produce $SiO_2$ (or $SiO_x$). Each iteration of the PEALD cycle increases the thickness of the deposited dielectric thickness. In one embodiment, the preferred thickness is 4-12 Å which may be used as part of the Tunnel dielectric, although varying thicknesses of this selective-dep film may be used based on the application.

Following the last PEALD cycle, a plasma passivation operation is performed in block 914. Plasma passivation is used to reduce the Fluoride contamination that may result from use of $NF_3$.

As discussed above, the selective deposition process is followed by forming a capping dielectric film (e.g., a capping oxide) in block 806. When used in the floating-gate structure of circuit 500 in FIG. 5, tunnel dielectric film 753 corresponds to oxide 550. Subsequently, a channel conductor is formed over tunnel dielectric film 753, as shown in circuit state 714 in FIG. 7*h*. The channel conductor is represented as channel 757. In one example, channel 757 is a lightly doped (1e17/cm$^3$-5e17/cm$^3$) polysilicon material such as n-type (electron carrier majority) or p-type (hole carrier majority) channel.

Figure 10:
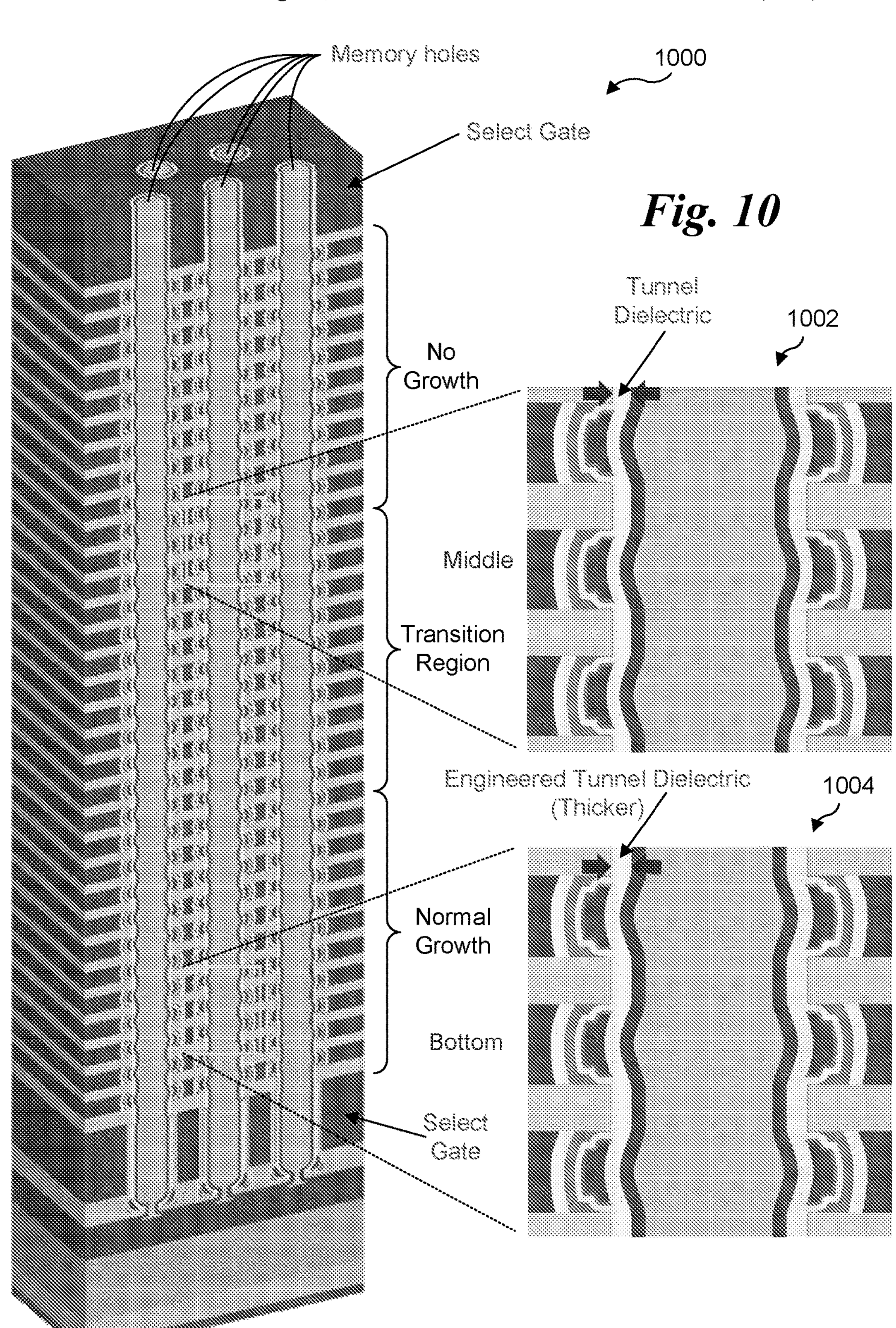
FIG. 10 shows an isometric cross-section view of a 3D memory structure and a pair of 2D cross-section details illustrating tunnel dielectric profiles.

FIG. 10 shows an isometric cross-section view of a 3D memory structure 1000 showing the memory holes and a pair of 2D cross-section details 1002 and 1004. For illustrative purposes, the height of the structure is not to scale, i.e., the number of memory tiers could be higher in reality. As shown, the depth of the memory holes is partitioned into three regions for the purposes of illustration of the engineered Tunnel dielectric profile described in earlier sections. In the upper region toward the top of the memory holes, the tunnel-dielectric film thickness is un-altered and is a result of ISSG oxidation process. In the transition region, towards the middle portion, the tunnel-dielectric film thickness consists of a tapered profile as a result of the selective-deposition process from thinner to thick as the memory hole depth increases. The lower region toward the bottom of the memory holes has full thickness of the selective dielectric dep sandwiched between the base layer and capping layers formed via ISSG oxidation as described in prior sections.

In 2D cross-section detail 1002, which shows memory cells at three wordlines in a middle depth and in the transition region, the thickness of the tunnel dielectric is less than the tunnel dielectric shown in 2D cross-section detail 1004, which shows memory cells at three wordlines toward the bottom of 3D memory structure 1000.

Figure 11:
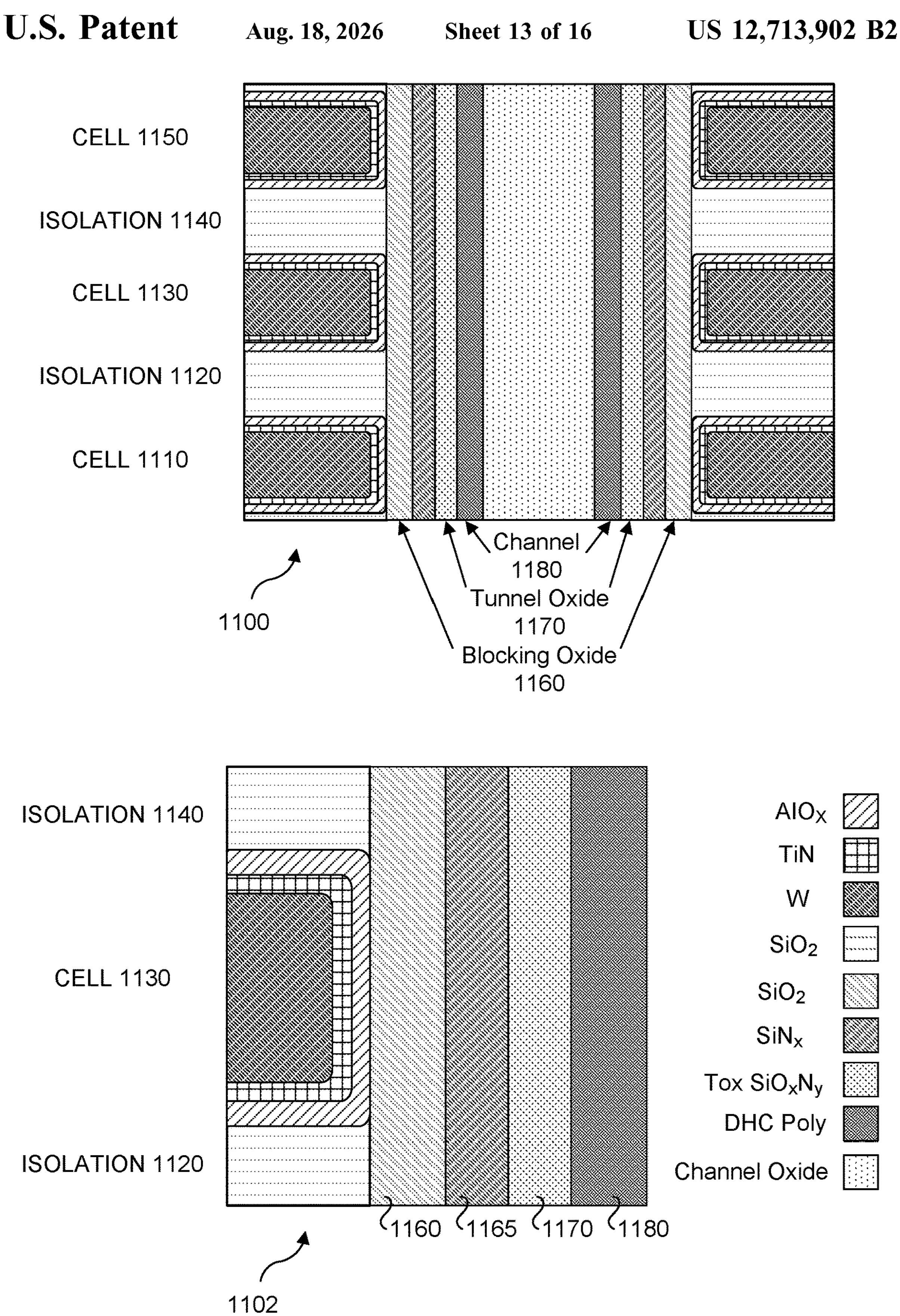
FIG. 11 shows cross sections of the structure of a 3D memory device using Charge-Trap Flash (CTF) cells.

The engineered dielectric profile approach may be applied to other memory cell structures, such as Charge-Trap Flash (CTF) cells, hemicylindrical cells, and trench cells. For example, FIG. 11 shows cross sections 1100 and 1102 of the structure of a 3D memory device using CTF cells. As shown in cross section 1100, the 3D memory structure includes cells 1110, 1130, and 1150 separated by isolation (layers) 1120 and 1140. The material that is added (e.g., via deposition and/or growth) includes a blocking dielectric film 1160, a charge-trap dielectric film 1165, a tunnel dielectric 1170, and a poly-Si channel 1180. The memory hole is then filled with channel oxide. Engineered dielectric profile approach can be applied to form one or more CTF cell films (blocking oxide 1160 and tunnel oxide 1170) to tune the step coverage profile on the limiting wordlines in a similar manner to that described and illustrated above for floating gate (FG) charge-storage cells. This approach therefore may help to alleviate the aspect-ratio dependent step-coverage limitation and enables the vertical 3D NAND cell scaling.

Figure 12:
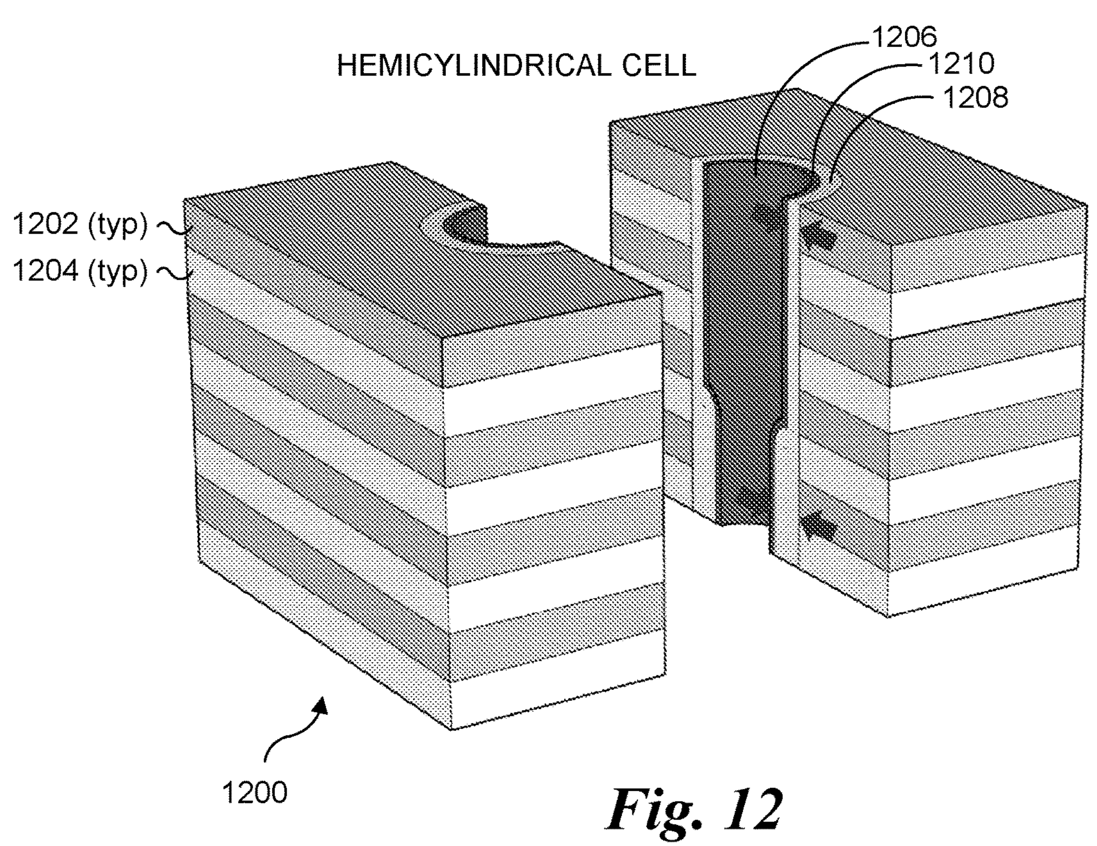
FIG. 12 shows an isometric cut-away view of a hemicylindrical cell employing an engineered dielectric profile, according to one embodiment.
Figure 13:
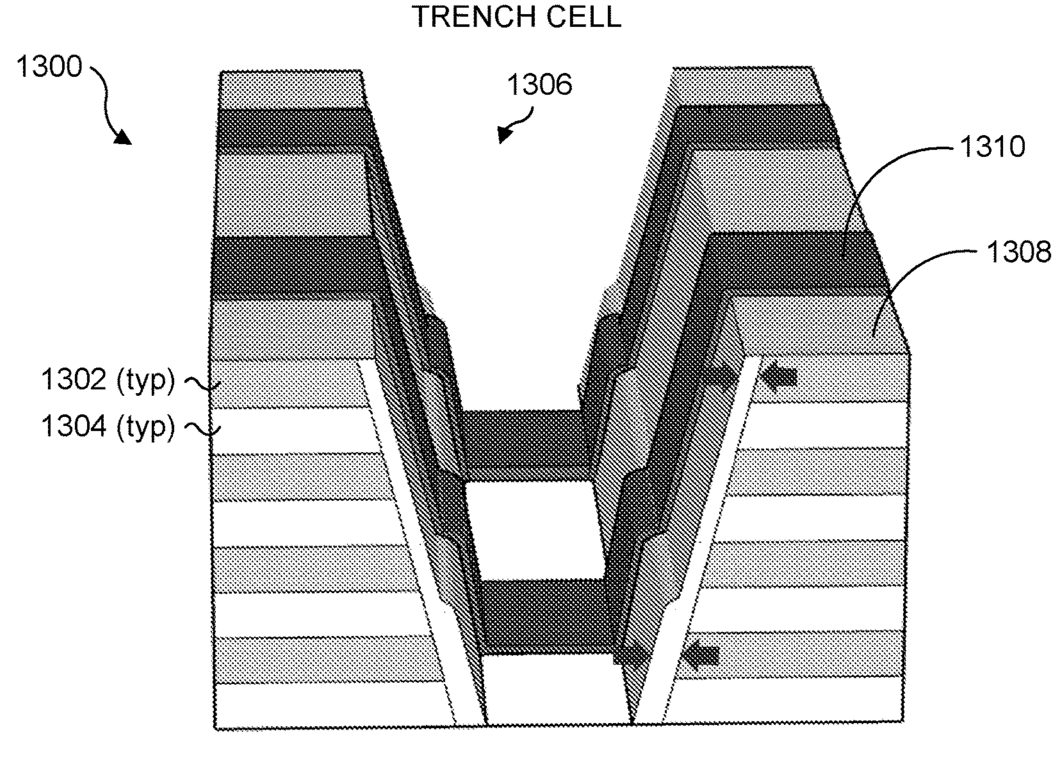
FIG. 13 shows an isometric cut-away view of a planar trench cell employing an engineered dielectric profile, according to one embodiment.

The engineered dielectric profile approach is extendible to alternate cell topologies with high aspect-ratio features. For example, FIGS. 12 and 13 respectively show a hemicylindrical cell 1200 and a trench cell 1300 for which the proposed approach has been applied to tune the profile of the dielectric along the height of the structures. Hemicylindrical cell 1200 shows a tiered structure of alternating circuit layers 1202 in which wordlines, and cells are formed and isolation layers 1204. A cavity to become a memory hole 1206 is formed in the tiered structure, followed by processes to create the outer memory cell features (not shown in FIG. 12 for clarity). The tunnel dielectric 1208 is then formed with engineered profile to have a gradual change in thickness using the proposed approach (e.g., such as illustrated and described in FIGS. 7*e-g* and flowcharts 800 and 900). Subsequently, a channel material 1210 may be formed over the tunnel dielectric to complete the device formation. This approach may be used for both floating gate (FG) charge storage cells and charge-trap (CTF) cells.

A similar approach is used for trench cell 1300. As before, the tiered structure includes alternating circuit layers 1302 and isolation layers 1304. A trench 1306 is then formed in the tiered structure. For illustrative purposes, the angle of the sidewalls of trench 1306 are exaggerated—in practice, the trench walls will be nearly vertical with a small taper from top to bottom. Following processing to form the outer memory cell features (not shown in FIG. 13 for clarity), tunnel oxide 1308 is formed over the trench walls. A channel material 1310 is formed over a portion of tunnel oxide 1308. The profile of tunnel oxide may have a step change (as shown), or the engineered dielectric profile may be used such that the thickness of the tunnel dielectric gradually increases with depth in a manner similar to implemented for the memory holes in the 3D memory structures described and illustrated in the embodiments above. This approach may be used for both floating gate (FG) cells and charge-trap (CTF) cells.

Figure 14A:
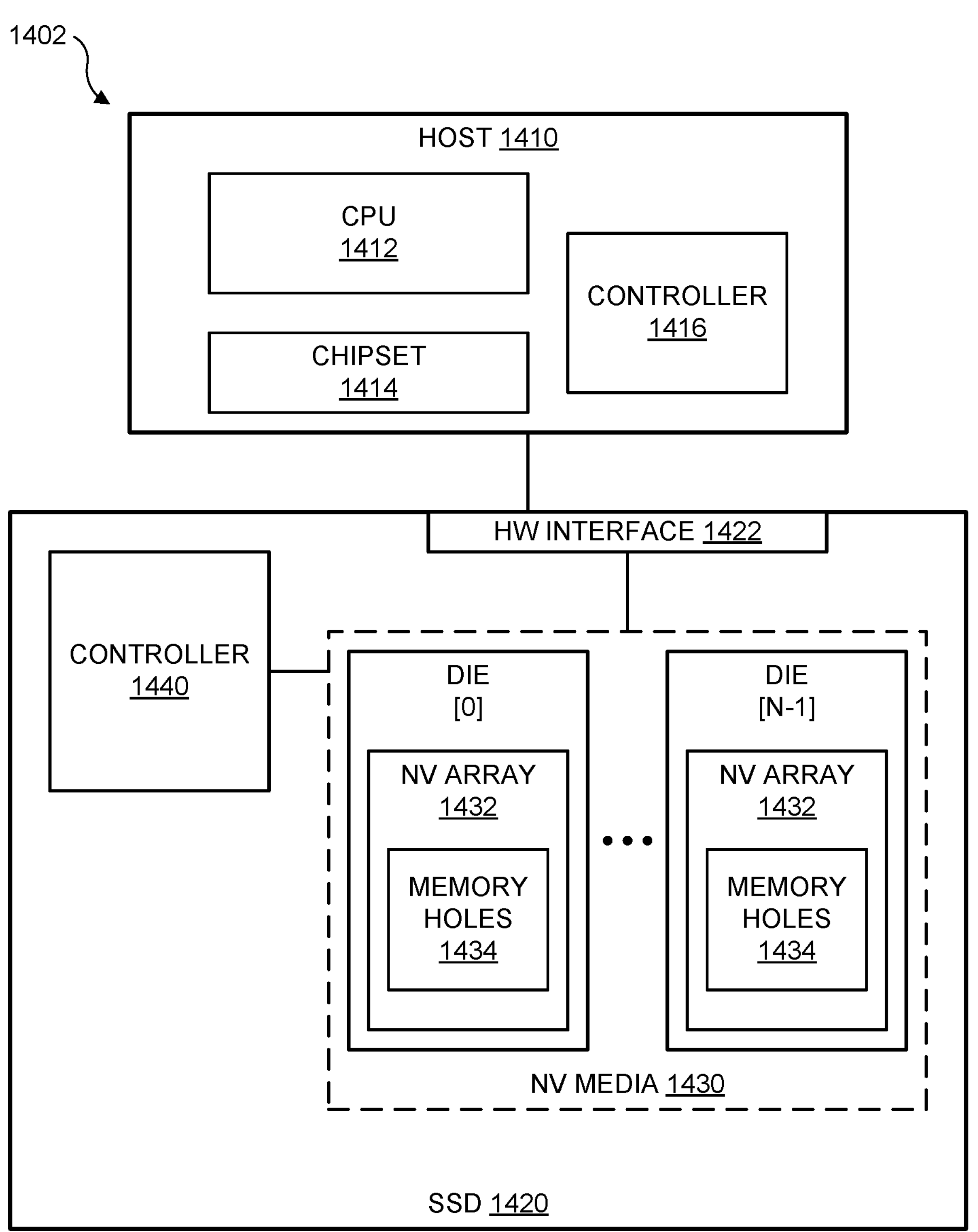
FIG. 14*a* is a block diagram of an example of a system with a hardware view of a solid-state drive (SSD) with a nonvolatile array having a vertical channel with conductive structures.

FIG. 14*a* is a block diagram of an example of a system with a hardware view of a solid-state drive (SSD) with a nonvolatile array having a vertical channel with conductive structures. System 1402 represents components of a nonvolatile storage system that could implement nonvolatile media having a high AR memory hole structures in accordance with any example described, or in accordance with the processing sequences described above.

System 1402 includes SSD 1420 coupled with host 1410. Host 1410 represents a host hardware platform that connects to SSD 1420. Host 1410 includes CPU (central processing unit) 1412 or other processor as a host processor or host processor device. CPU 1412 represents any host processor that generates requests to access data stored on SSD 1420, either to read the data or to write data to the storage. Such a processor can include a single or multicore processor, a primary processor for a computing device, a graphics processor, a peripheral processor, or a supplemental or auxiliary processor, or a combination. CPU 1412 can execute a host OS and other applications to cause the operation of system 1402.

Host 1410 includes chipset 1414, which represents hardware components that can be included in connecting between CPU 1412 and SSD 1420. For example, chipset 1414 can include interconnect circuits and logic to enable access to SSD 1420. Thus, host 1410 can include a hardware platform drive interconnect to couple SSD 1420 to host 1410. Host 1410 includes hardware to interconnect to the SSD. Likewise, SSD 1420 includes corresponding hardware to interconnect to host 1410.

Host 1410 includes controller 1416, which represents a storage controller or memory controller on the host side to control access to SSD 1420. In one example, controller 1416 is included in chipset 1414. In one example, controller 1416 is included in CPU 1412. Controller 1416 can be referred to as an NV memory controller to enable host 1410 to schedule and organize commands to SSD 1420 to read and write data.

SSD 1420 represents a solid-state drive or other storage system or module that includes nonvolatile (NV) media 1430 to store data. SSD 1420 includes HW (hardware) interface 1422, which represents hardware components to interface with host 1410. For example, HW interface 1422 can interface with one or more buses to implement a high-speed interface standard such as NVMe (nonvolatile memory express) or PCIe (peripheral component interconnect express).

In one example, SSD 1420 includes NV (nonvolatile) media 1430 as the primary storage for SSD 1420. In one example, NV media 1430 is or includes a block addressable memory technology, such as NAND (not AND) or NOR (not OR). In one example, NV media 1430 can include a nonvolatile media that can be block addressable or byte addressable, which stores data based on a resistive state of the memory cell, or a phase of the memory cell. For example, NV media 1430 can be or include a 3D XPOINT™ (3DXP) memory or a storage array based on chalcogenide phase change material (e.g., chalcogenide glass). In one example, the NV media can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

In one example, NV media 1430 is implemented as multiple dies, illustrated as N dies, Die[0:{N−1}]. N can be any number of devices, and is often a binary number. SSD 1420 includes controller 1440 to control access to NV media 1430. Controller 1440 represents hardware and control logic within SSD 1420 to execute control over the media. Controller 1440 is internal to the nonvolatile storage device or module, and is separate from controller 1416 of host 1410.

The NV dies of NV media 1430 include NV array 1432, which represents a 3D array of storage cells based on the NV media. NV array 1432 includes arrays of memory holes having an engineered dielectric profile and labeled as memory holes 1434. Memory holes 1434 include one or more layers of dielectric material(s), such as but not limited to tunnel oxides, having an engineered dielectric profile in accordance with one of more of the embodiments described and illustrated herein.

Figure 14B:
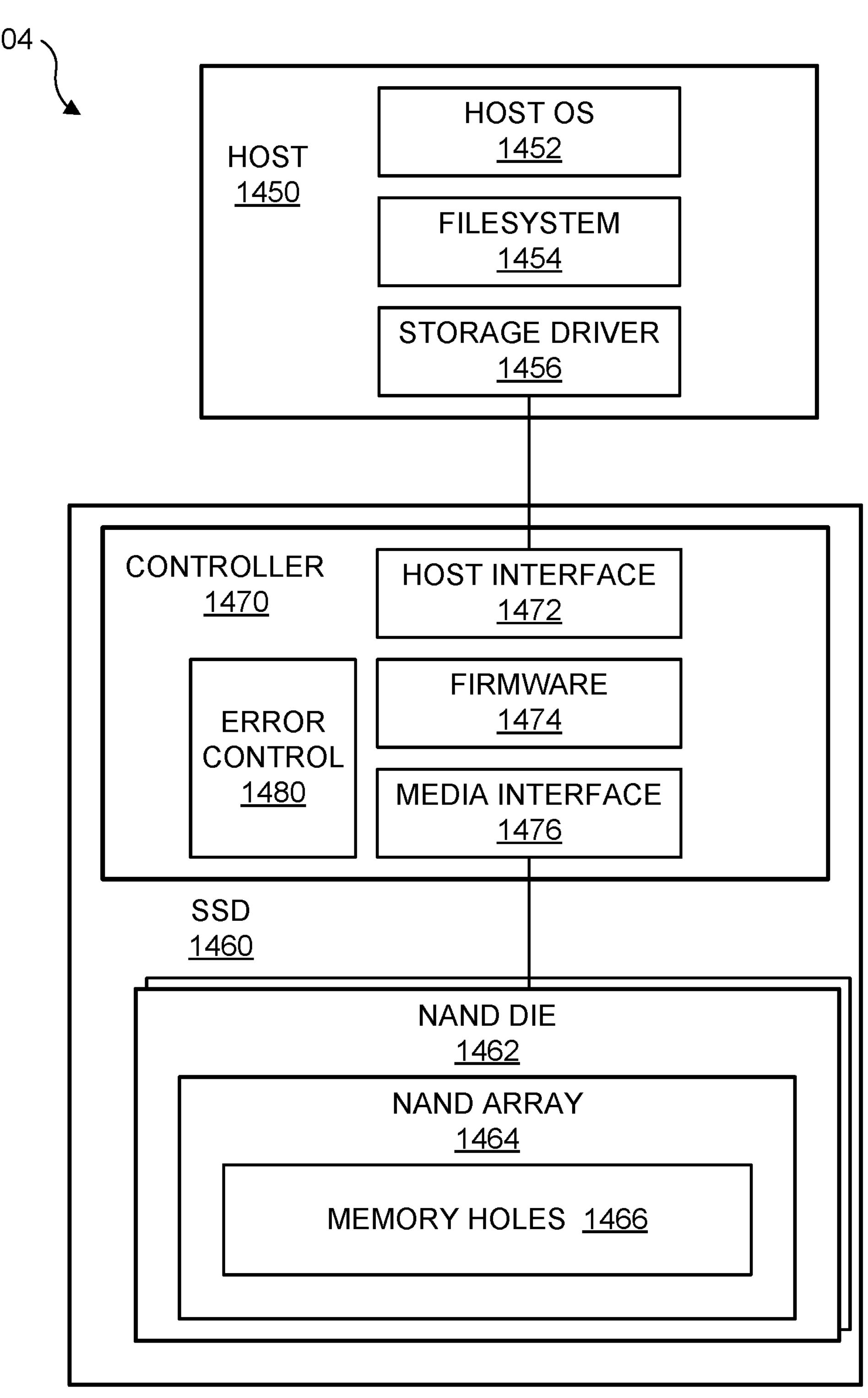
FIG. 14*b* is a block diagram of an example of a logical view of system with a solid-state drive (SSD) with a nonvolatile array having a vertical channel with conductive structures.

FIG. 14*b* is a block diagram of an example of a logical view of system with a solid-state drive (SSD) with a nonvolatile array having a vertical channel with conductive structures. System 1404 provides one example of a system in accordance with system 1402 of FIG. 14*b*. System 1404 illustrates the logical layers of the host and SSD of a hardware platform in accordance with system 1402. System 1404 can represent software and firmware components of an example of system 1402, as well as physical components. In one example, host 1450 provides one example of host 1410. In one example, SSD 1460 provides one example of SSD 1420.

In one example, host 1450 includes host OS 1452, which represents a host operating system or software platform for the host. Host OS 1452 can include a platform on which applications, services, agents, and/or other software executes, and is executed by a processor. Filesystem 1454 represents control logic for controlling access to the NV media. Filesystem 1454 can manage what addresses or memory locations are used to store what data. There are numerous filesystems known, and filesystem 1454 can implement known filesystems or other proprietary systems. In one example, filesystem 1454 is part of host OS 1452.

Storage driver 1456 represents one or more system-level modules that control the hardware of host 1450. In one example, drivers 1456 include a software application to control the interface to SSD 1460, and thus control the hardware of SSD 1460. Storage driver 1456 can provide a communication interface between the host and the SSD.

Controller 1470 of SSD 1460 includes firmware 1474, which represents control software/firmware for the controller. In one example, controller 1470 includes host interface 1472, which represents an interface to host 1450. In one example, controller 1470 includes media interface 1476, which represents an interface to NAND die 1462. NAND die 1462 represents a specific example of NV media, and includes an associated NAND array 1464, which represents a 3D NAND array.

NAND array 1464 includes arrays of memory holes having an engineered dielectric profile and labeled as memory holes 1466. Memory holes 1466 include one or more layers of dielectric material(s), such as but not limited to tunnel oxides, having an engineered dielectric profile in accordance with one or more of the embodiments described and illustrated herein.

Media interface 1476 represents control that is executed on hardware of controller 1470. It will be understood that controller 1470 includes hardware to interface with host 1450, which can be considered to be controlled by host interface software/firmware 1474. Likewise, it will be understood that controller 1470 includes hardware to interface with NAND die 1462. In one example, code for host interface 1472 can be part of firmware 1474. In one example, code for media interface 1476 can be part of firmware 1474.

In one example, controller 1470 includes error control 1480 to handle data errors in accessed data, and corner cases in terms of compliance with signaling and communication interfacing. Error control 1480 can include implementations in hardware or firmware, or a combination of hardware and software.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A three-dimensional (3D) memory device, comprising:
a plurality of memory tiers comprising wordline layers interposed between isolation layers, a memory tier comprising a two-dimensional (2D) array of memory cells,
a plurality of vertical structures passing through memory cells in the wordline layers and passing through the isolation layers,
a tunnel dielectric, formed over sidewalls of the vertical structures, the tunnel dielectric having a cross-section profile where a first thickness of the tunnel dielectric for a bottom wordline layer is thicker than a second thickness of the tunnel dielectric for at least a portion of the wordline layers disposed above the bottom wordline layer, wherein the first thickness and the second thickness of the tunnel dielectric are measured horizontally.

2. The 3D memory device of claim 1, wherein a quality of the tunnel dielectric at the bottom wordline layers matches a quality of the tunnel dielectric for at least one or more of a middle wordline layer and a top wordline layer.

3. The 3D memory device of claim 1, wherein the vertical structures comprise memory holes.

4. The 3D memory device of claim 1, wherein the vertical structures comprise trenches.

5. The 3D memory device of claim 1, wherein the tunnel oxide cross-section profile has a third thickness for a wordline proximate to a top of the vertical structures that substantially matches the first thickness.

6. The 3D memory structure of claim 1, wherein the plurality of memory cells comprises floating gate memory cells or Charge-Trap Flash (CTF) memory cells.

7. A system comprising:

a host, including a processor;

a three-dimensional (3D) NAND memory device, coupled to the host, having, a plurality of memory tiers comprising wordline layers interposed between isolation layers, a memory tier comprising a two-dimensional (2D) array of memory cells;

a plurality of memory holes passing through memory cells in the wordline layers and passing through the isolation layers;

a dielectric, formed over sidewalls of the memory holes, the dielectric having a cross-section profile on which a first thickness of the dielectric for a bottom wordline layer is thicker than a second thickness of the dielectric for at least a portion of the wordline layers disposed above the bottom wordline layer, wherein the first thickness and the second thickness of the dielectric are measured horizontally.

8. The system of claim 7, wherein the memory holes have a depth to diameter aspect ratio of at least 25:1.

9. The system of claim 7, wherein the dielectric cross-section profile has a third thickness for a wordline layer proximate to a top of the memory holes that substantially matches the first thickness.

10. The system of claim 7, wherein the plurality of memory cells comprises floating gate memory cells or Charge-Trap Flash (CTF) memory cells.

11. The system of claim 7, wherein the plurality of memory cells comprises Charge-Trap Flash (CTF) memory cells, and wherein the dielectric comprises at least one of a blocking dielectric layer and a tunnel dielectric layer.

* * * * *